United States Patent [19]
Yamamoto et al.

[11] Patent Number: 5,444,651
[45] Date of Patent: Aug. 22, 1995

[54] NON-VOLATILE MEMORY DEVICE

[75] Inventors: Yoshitaka Yamamoto, Yamatokoriyama; Yutaka Ishii, Nara, both of Japan

[73] Assignee: Sharp Kabushiki Kaisha, Osaka, Japan

[21] Appl. No.: 942,947

[22] Filed: Sep. 9, 1992444651331002365182

[51] Int. Cl.⁶ .................... B32B 3/00; G02F 1/133
[52] U.S. Cl. ................... 365/108; 365/182; 365/151; 428/1; 369/288
[58] Field of Search ................ 365/182; 428/1; 346/108; 350/350.5; 252/299.01

[56]  References Cited
U.S. PATENT DOCUMENTS

| | | | |
|---|---|---|---|
| 4,390,244 | 6/1983 | Hareng et al. | |
| 4,965,591 | 10/1990 | Kurabayashi et al. | 346/108 |
| 4,983,318 | 1/1991 | Matsumoto et al. | 252/299.01 |
| 5,124,183 | 6/1992 | Narkano et al. | 428/1 |

FOREIGN PATENT DOCUMENTS

| | | |
|---|---|---|
| 61-118492 | 6/1986 | Japan . |
| 61-118725 | 6/1986 | Japan . |
| 226119 | 2/1990 | Japan . |

OTHER PUBLICATIONS

Polymer Liquid Crystals, Polymer, vol. 38, pp. 376–379, May 1989 (partial).

*Primary Examiner*—Viet Q. Nguyen
*Attorney, Agent, or Firm*—David G. Conlin; Peter F. Corless

[57] ABSTRACT

As a memory medium, a liquid crystal composite or a composite including a liquid crystal component in a molecule is used. The memory medium is heated by a heat generating layer which is heated by a pair of electrodes, thereby changing a phase of the memory medium. Thus, data is written into the memory medium. A change in a property or a phase transition of the memory medium is electrically or optically detected, thereby reading the data from the memory medium.

50 Claims, 16 Drawing Sheets

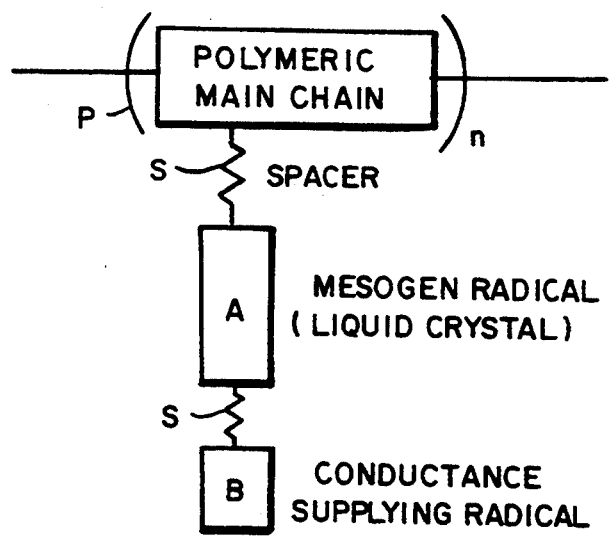
FIG. 15
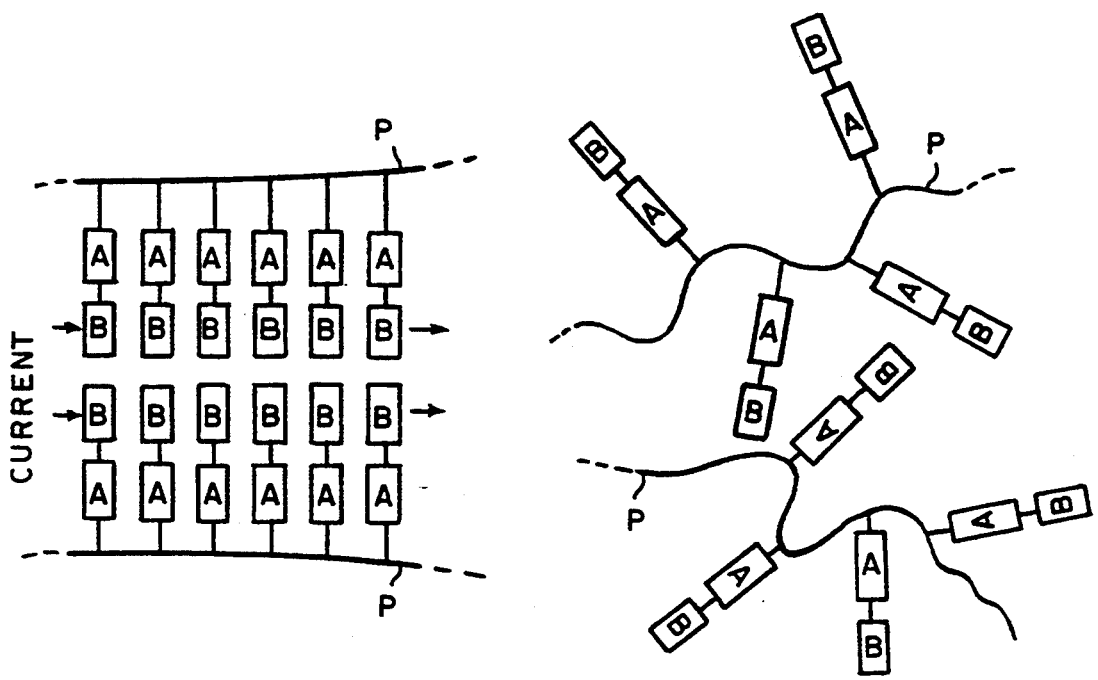
FIG. 16A
FIG. 16B

NON-VOLATILE MEMORY DEVICE

CROSS-REFERENCE TO RELATED APPLICATION

This application is a continuation-in-part of U.S. patent application Ser. No. 07/896,097, filed on Jun. 10, 1992.

BACKGROUND OF THE INVENTION

1. Field of the Invention

The present invention relates to a non-volatile memory device with a large capacity and a high density. More particularly, the present invention relates to a non-volatile memory device adapted for use in a computer, a memory card, a wordprocessor, and the like.

2. Description of the Prior Art

As non-volatile memory devices, the following four are well known and widely used:

(1) Magnetic tape,
(2) Magnetic disc,
(3) IC non-volatile memory such as EPROM and EEPROM, and
(4) Optical magnetic disc.

Each of these devices will be more particularly described.

(1) Magnetic tape

A magnetic tape is a most typical rewritable non-volatile memory device. It is in wide use for an audio tape and a video tape for the low price thereof, and also is used for a back-up memory of a computer for a very large capacity thereof.

The magnetic tape has disadvantages of performing only sequential data writing and reading and of long access time.

(2) Magnetic disc

A magnetic disc is generally used for an external memory device of a computer or a wordprocessor. Magnetic discs include a floppy disc which is easy to handle and inexpensive and a hard disc which has a larger capacity but is harder to handle and more expensive than a floppy disc.

A magnetic disc has advantages of a high-speed random access and relatively easy data writing and rewriting.

The magnetic disc has a limit in improving the capacity and the density. For example, the capacity of a 3.5-inch floppy disc is approximately 1 megabyte, and that of a 3.5-inch hard disc is approximately 40 megabytes.

(3) EPROM and EEPROM

EPROM and EEPROM are representative IC non-volatile memory devices, which are rewritable and are capable of high density writing. In the EPROM, writing is electrically effected and erasing is effected by ultraviolet irradiation. In the EEPROM, both writing and erasing are electrically effected. These IC non-volatile memory devices have advantages such as compactness, lightness, short access time and low power consumption.

The EEPROM, which is capable of electrical writing and erasing, will be described in detail. FIG. 28 is a cross sectional view of a memory cell of an EEPROM. The memory cell includes a silicon substrate 7, a gate oxide film 5 provided on the silicon substrate 7, and a floating gate 4 and a control gate 2 provided on the gate oxide film 5. The floating gate 4 has a function of accumulating and keeping carriers. The control gate 2 has a function of controlling injection of the carriers to the floating gate 4. The floating gate 4 and the control gate 2 are insulated from each other by an insulating film 3 formed of silicon oxide. On the silicon substrate 7, a surface passivation film 1 is provided so as to cover the floating gate 4 and the control gate 2. The surface passivation film 1 is usually formed of silicon oxide or silicon nitride. The silicon substrate 7 has a source area 8 and a drain area 6 formed by impurity injection at upper portions thereof. A channel area 9 is provided between the source area 8 and the drain area 6.

For writing data in an EEPROM having the above construction, a voltage is applied between the drain area 6 and the control gate 2, and carriers are injected to the floating gate 4 through the gate oxide film 5. For erasing the data, a voltage is applied between the source area 8 and the control gate 2, and the carriers are removed utilizing the Fowler-Nordheim (N-F) Tunneling phenomenon. For reading the data, ON or OFF is judged based on a threshold of the inverting voltage at the channel area 9 between the source area 8 and the drain area 6.

In the above construction, since carrier injection and removal are done through the gate oxide film 5, the quality and the thickness of the gate oxide film 5 are very important. In an EEPROM having a memory capacity of 1 megabit, the gate oxide film 5 usually has a thickness of approximately 20 nm. Accordingly, it is difficult to control the quality and the thickness thereof, causing a serious problem that the production cost is increased due to the decline of the yield. Both long and short sides of an EEPROM chip are usually 7 to 10 mm. An enlargement of the size in order to increase the memory capacity lowers the yield and thus raises the production cost.

For the above problems, the EEPROM is limited in improving the memory capacity. The average memory capacity of the EEPROMs used today is approximately 1 to 4 megabits, which is smaller than the other non-volatile memory devices such as a magnetic disc and an optical magnetic disc.

(4) Optical magnetic disc

An optical magnetic disc capable of rewriting is one of the representative large capacity non-volatile memory devices.

FIG. 29 shows a construction of an optical magnetic disc. The optical magnetic disc includes magnetic thin films 15 and 16 as memory mediums. The magnetic thin films 15 and 16 show perpendicular magnetization. For writing data, a laser beam 20 is converged to a convergence area 21 in a weak magnetic field which has an opposite polarity to that of the magnetic field to which the magnetic thin films 15 and 16 have been magnetized. Data is written in the magnetic thin films 15 and 16 by local heating. Data reading is effected utilizing the Kerr effect or the Faraday effect. In more detail, when the laser beam 20 which is linearly polarized is emitted to the disc, the plane of polarization of light transmitted through or reflected by the disc is rotated in accordance with the condition of magnetization of the magnetic thin films 15 and 16. Such a rotation of the plane of polarization is converted into an optical signal using an analyzer and then is detected by a photo detector as an electric signal. Thus, the data is read out. The optical magnetic disc is practically used for a large capacity memory device for document files and image files.

In the optical magnetic disc, writing can be done without contact by emitting the laser beam 20 through a transparent glass substrate 12. Accordingly, dust on a writing plane 23 causes no problem. Since the laser beam 20 is not focused on a surface 22 of the glass substrate 12, the laser beam 20 has a large diameter of several hundred microns at the surface 22. Accordingly, the presence of dust here does not have any serious affect.

Owing to the writing and reading by use of the converged laser beam 20, high density writing is realized. For example, a 3.5-inch disc has a large capacity of approximately 120 megabytes.

A disadvantage of the optical magnetic disc is that a rotating mechanism required for rotating the disc enlarges the writing and reading apparatus and thus increases the production cost.

Conventional rewritable non-volatile memory devices have the above-mentioned advantages and disadvantages. An ideal non-volatile memory device must fulfill the following four requirements, which cannot be achieved by any conventional device for the following reasons.

(1) Large capacity and high density

A floppy disc cannot meet this requirement as is apparent from the fact that a 3.5-inch floppy disc has a capacity of only 1 megabyte.

IC non-volatile memory devices such as an EPROM or an EEPROM can realize high density, but not a large capacity due to the restriction of the area thereof.

(2) Resistance against impact and vibration

In the case of a hard disc, a large capacity can be realized by integrating a plurality of discs. In this case, however, the distance between a head and the disc is as microscopic as 1 micron or less. Such a device is easily destroyed by impact, vibration, or even microscopic dust adhering on the head or the disc.

(3) Compact, simple and inexpensive device for writing and reading

Since a floppy disc, a hard disc and an optical magnetic disc effect writing and reading by rotating a disc, a rotating mechanism such as a motor is required. Accordingly, the writing and reading apparatus is inevitably large and complicated.

In the case of a hard disc, an alleviating material is required in order to guarantee a precise distance between the disc and the head and resistance against impact. The alleviating material enlarges and complicates the writing and reading apparatus.

An optical magnetic disc also requires a large and complicated writing and reading apparatus because of the use of a laser and a magnet.

(4) High-speed writing and reading

A floppy disc, a hard disc and an optical magnetic disc have a limit in enhancing a reading speed thereof since data is searched by rotating the disc. A magnetic tape is especially slow in writing and reading.

Since no conventional non-volatile memory device fulfills all the four requirements, a completely novel device has been demanded.

SUMMARY OF THE INVENTION

The non-volatile memory device according to the present invention includes a memory medium which is formed of a material selected from the group consisting of a liquid crystal composite and a composite including a liquid crystal component in a molecule; and a heating element including a pair of electrode layers and a heat generating layer interposed between the electrode layers, the heating element being provided for writing data into the memory medium by heating the memory medium through the heat generating layer and thus changing a phase of the memory medium; and a reading element for reading the data written into the memory medium by electrically or optically detecting a change in a property or a phase transition of the memory medium.

In the non-volatile memory device according to the present invention, data is written by electrically heating a liquid crystal. Owing to this principle, the memory capacity is significantly enhanced and the density is also increased while the size of the apparatus is reduced. Moreover, since a high-speed random access is possible, data writing and reading can be done at a high speed. Writing and reading errors due to impact or vibration do not occur, which improves writing and reading accuracy.

Thus, the invention described herein makes possible the advantage of providing a non-volatile memory device which is capable of a high density, large capacity memory and accurate and high-speed writing and reading, and allows for a compact, simple and inexpensive writing and reading apparatus.

These and other advantages of the present invention will become apparent to those skilled in the art upon reading and understanding the following detailed description with reference to the accompanying figures.

BRIEF DESCRIPTION OF THE DRAWINGS

FIG. 15 is a schematic view showing a chemical structure of a conductive polymeric liquid crystal used in a non-volatile memory device according to a fourth example of the present invention.

FIG. 16A is a schematic view of the conductive polymeric liquid crystal in the state where mesogen radicals and charge-transfer complexes are aligned.

FIG. 16B is a schematic view of the conductive polymeric liquid crystal in the state where neither mesogen radicals nor the charge-transfer complexes are aligned.

DESCRIPTION OF THE PREFERRED EMBODIMENTS

Hereinafter, the present invention will be described by way of illustrating examples with reference to the accompanying drawings.

EXAMPLE 1

Figure 1:
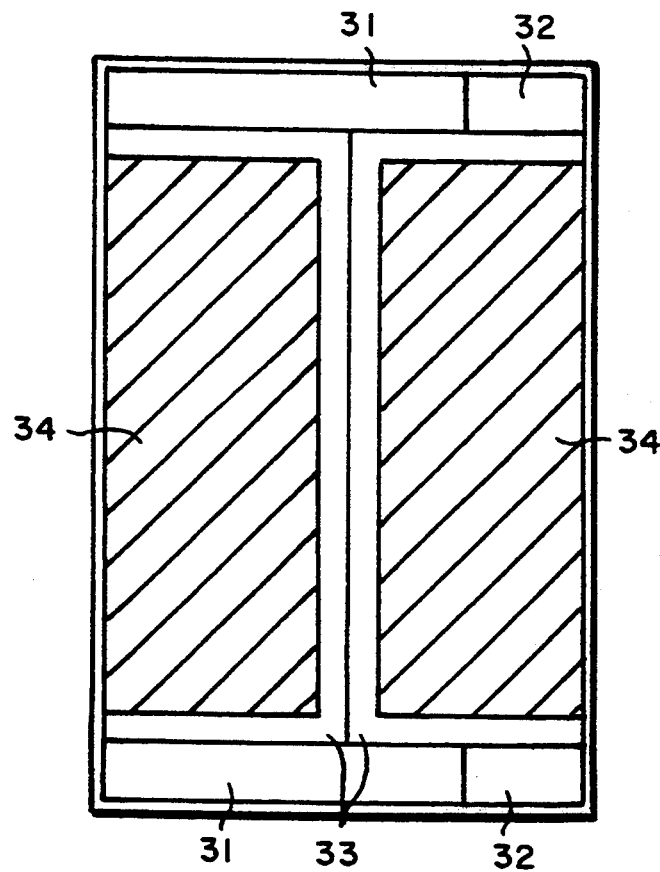
FIG. 1 is a plan view of a non-volatile memory device according to a first example of the present invention.

FIG. 1 schematically shows a plan view of a non-volatile memory device according to a first example of the present invention. The non-volatile memory device includes a pair of recording sections 34 each having a plurality of memory cells 43 (FIG. 4) and circuit sections 31 through 33 each provided in pairs around the recording sections 34. Since the pair of recording sections 34 and the circuit sections 31 through 33 are identical to each other, only one of the pair will be described for simplicity. The circuit sections 31 through 33 have different functions from one another. The circuit section 31 has a function of processing a signal sent from an external device and sending the signal to each memory cell 43 of the recording section 34 as memory data and another function of processing a signal read out from the memory cell 43 and sending the signal to an external device. (Hereinafter, the circuit section 31 will be referred to as the input/output signal controlling section 31.) The circuit section 32 has a function of entirely controlling signal processing performed in the non-volatile memory device. (Hereinafter, the circuit section 32 will be referred to as the logic controlling section 32.) The circuit section 33 has a function of controlling an electric current for supplying an electric signal to each memory cell 43 of the recording section 34 in response to an instruction from the logic controlling section 32. (Hereinafter, the circuit section 33 will be referred to as the driving circuit section 33.) The recording section 34 has a function of accumulating signals sent from the input/output signal controlling section 31 and storing the signals as memory data.

Figure 3:
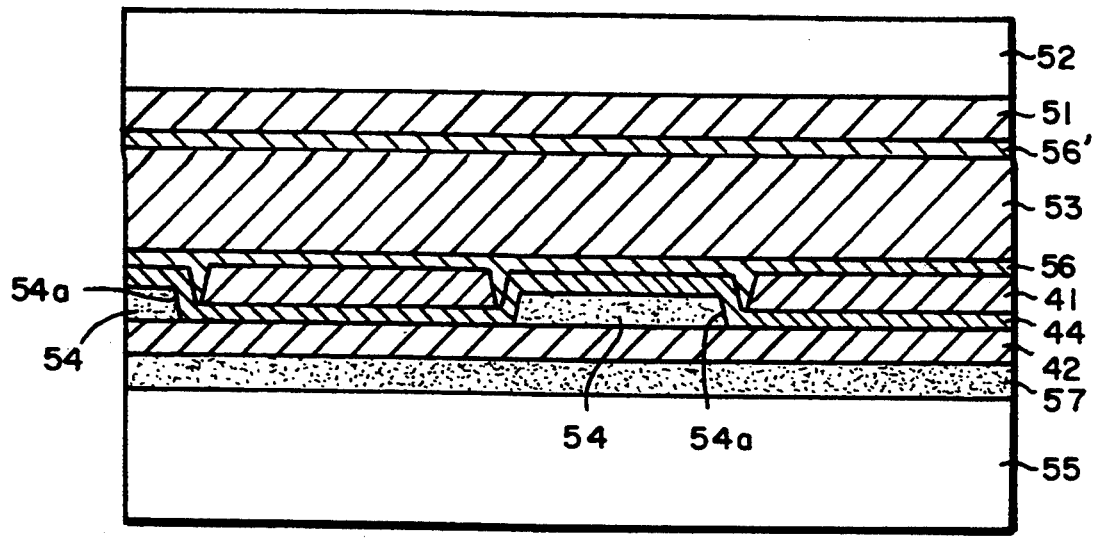
FIG. 3 is a cross sectional view of an essential part of the recording section of the non-volatile memory device according to the first example.

As is shown in FIG. 3, the recording section 34 includes a silicon substrate 55, a glass substrate 52 opposed to the silicon substrate 55, and a liquid crystal layer 53 enclosed between the silicon substrate 55 and the glass substrate 52. On the silicon substrate 55, a heat generating layer 44 for heating the liquid crystal layer 53, and upper electrodes 41 and lower electrodes 42 for generating heat in the heat generating layer 44 in cooperation are provided. On the glass substrate 52, strip-like counter electrodes 51 are provided. The liquid crystal layer 53 is in electric contact with the upper electrodes 41 through an alignment film 56, and also with the counter electrodes 51 through another alignment film 56'.

Figure 4:
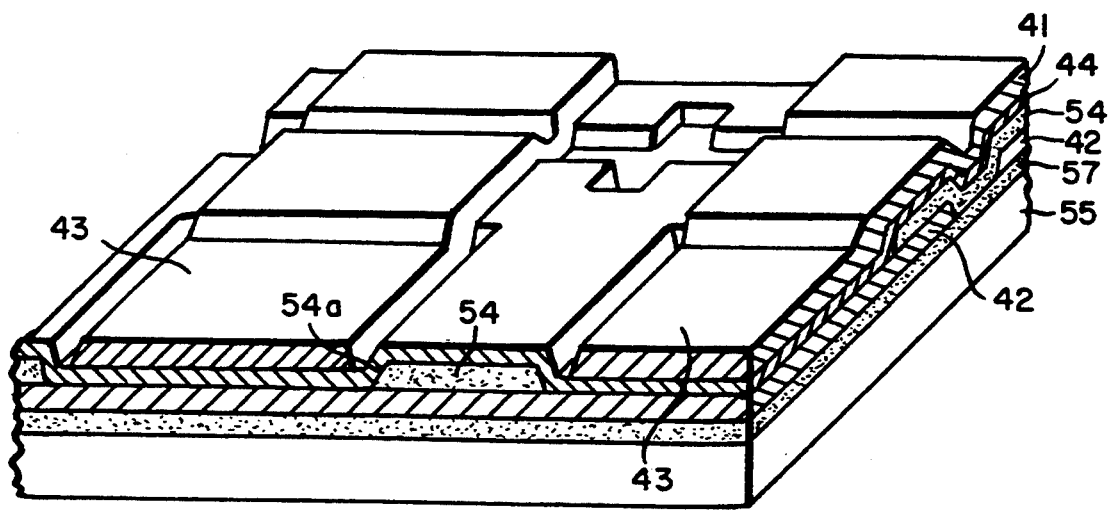
FIG. 4 is a perspective view of the recording section in the state where a liquid crystal is excluded.

FIG. 4 is a perspective view of the recording section 34 in the state where the glass substrate 52 having the counter electrodes 51 and the liquid crystal layer 53 are excluded. The upper electrodes 41 which are strip-like are arranged in parallel columns with a substantially uniform gap between adjacent upper electrodes 41. Below the upper electrodes 41, the lower electrodes 42 which are strip-like are arranged in parallel with a substantially uniform gap between adjacent lower electrodes 42. The lower electrodes 42 are arranged in rows perpendicular to the upper electrodes 41. The memory cells 43 are provided at portions of the liquid crystal layer 53, the portions corresponding to intersections of the upper electrodes 41 and the lower electrodes 42. As a material for the upper electrodes 41 and the lower electrodes 42, tungsten which is excellent in heat resistance is used in the first example. A pair of the upper electrode 41 and the lower electrode 42 corresponding to the memory cells 43 to which data is to be written are used for generating heat in the heat generating layer 44.

Figure 2:
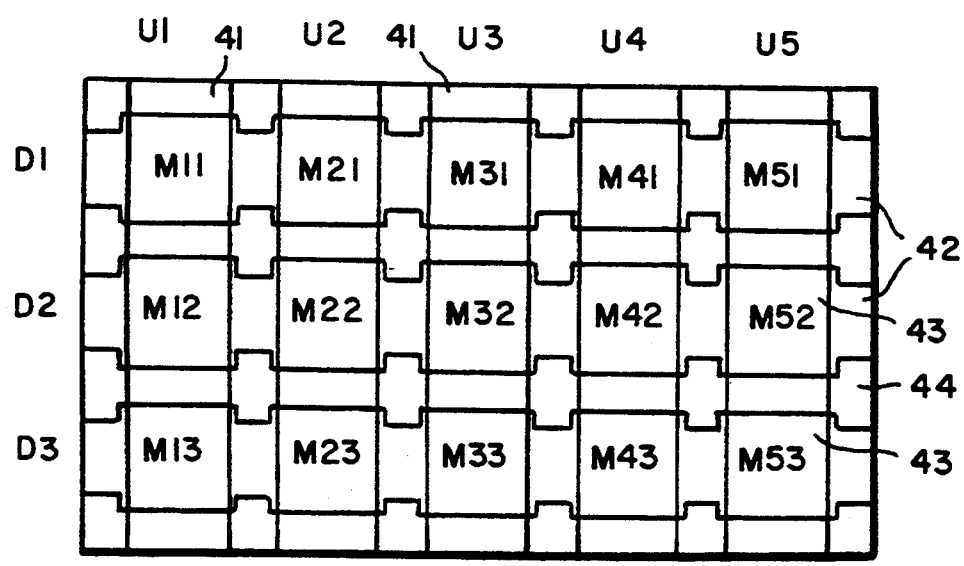
FIG. 2 is a plan view of a recording section of the non-volatile memory cell according to the first example.

As is mentioned above, the memory cells 43 are opposed to the intersections of the upper electrodes 41 and the lower electrodes 42. In FIG. 2, the upper electrodes 41 arranged columns are referred to as U1, U2, U3, U4 and U5, and the lower electrodes 42 arranged in rows are referred to as D1, D2 and D3. The memory cells are referred to as Mij (i is a reference number of the upper electrode 41, and j is a reference number of the lower electrode 42; i=1, 2, 3, 4 and 5; j=1, 2 and 3).

Referring to FIG. 3, a construction of the recording section 34 according to the first example will be described in detail.

On a surface of the glass substrate 52 opposed to the silicon substrate 55, the counter electrodes 51 are provided. On the counter electrodes 51, the alignment film 56' is provided. The liquid crystal layer 53 in contact with the alignment film 56' has a function of recording data based on a change in the alignment state or a phase transition of the liquid crystal.

The silicon substrate 55 is formed of single crystalline silicon generally used for ICs, to which an impurity is added, in order to control the electrical resistance thereof. A surface of the silicon substrate 55 is covered with a field insulating film 57, and the lower electrodes 42 are provided on the field insulating film 57. Thus, a driving current flowing to the lower electrodes 42 is prevented from leaking to the silicon substrate 55.

Between the upper electrodes 41 and the lower electrodes 42, an insulating film 54 is provided in order to keep the insulation therebetween. The insulating film 54 is formed of silicon nitride by use of a plasma CVD method in the first example. A voltage of 10 V or higher is possibly applied between a pair of the upper electrode 41 and the lower electrode 42, even in which case the insulation therebetween is guaranteed since the insulating film 54, formed of silicon nitride, has a uniform quality with no pinholes and also a uniform thickness.

The insulating film 54 has openings 54a at portions corresponding to the memory cells 43. In each opening 54a, a portion of the heat generating layer 44 interposed between a pair of the upper electrode 41 and the lower electrode 42 is located. Since the heat of the heat generating layer 44 raises the temperature of both the upper electrode 41 and the lower electrode 42 in an operation for writing or erasing memory data, the upper and lower electrodes 41 and 42 must be formed of a material having a high heat resistance. In the first example, the upper and lower electrodes 41 and 42 are formed of tungsten by use of a reduced-pressure CVD method. On the other hand, the heat generating layer 44 must be formed of a material which has an appropriate electrical resistance and is suitable for fine patterning as well as having a high heat resistance. In the first example, the heat generating layer 44 is formed of polysilicon having a high purity by use of a reduced-pressure CVD method.

On the upper electrodes 41 and the heat generating layer 44, the alignment film 56 is provided. For forming the alignment films 56, polyimide is coated on the upper electrodes 41 and the heat generating layer 44 and then heating and rubbing the resultant layer of polyimide. The alignment film 56′ is formed in the same manner. Instead of polyimide, any other material generally used for an alignment film may be used. The alignment films 56 and 56′ may be omitted if an appropriate liquid crystal material and appropriate writing and reading conditions are employed.

The upper and lower electrodes 41 and 42 are formed of tungsten by use of a reduced-pressure CVD method in the first example. Any other material may be used as long as the material is excellent in heat resistance and in chemical resistance, is easy to form and process, and is low in electrical resistance. The reduced-pressure CVD method may be replaced with any other method as long as the electrodes can be formed in a uniform thickness. The heat generating layer 44 is formed of polysilicon by use of a reduced-pressure CVD method in the first example. Any other material may be used as long as the material has an appropriate electrical resistance, is excellent in heat resistance and chemical resistance, and is easy to form and process. The reduced-pressure CVD method may be replaced with any other method as long as the heat generating layer 44 can be formed in a uniform thickness.

A production process of the recording section 34 will be described in detail. Although the non-volatile memory device includes, as well as the recording section 34, MOS ICs, namely, the input/output signal controlling section 31, the logic controlling section 32, and the driving circuit section 33 in the first example, the production process of only the recording section 34 will be described since the production process of the MOS ICs are known.

As the silicon substrate 55, a 6-inch p-type (100) single crystalline silicon wafer is used. The field insulating film 57 is formed in a thickness of 800 nm by thermally oxidizing the surface of the silicon substrate 55. On the field insulating film 57, the lower electrodes 42 are formed by depositing tungsten into a film having a thickness of 1.2 $\mu$m by use of a reduced-pressure CVD method and then patterning the film of tungsten by use of photolithography and dry etching. On the field insulating film 57 having the lower electrodes 42, the insulating film 54 is formed of silicon nitride by use of a plasma CVD method so as to have a thickness of 1.0 $\mu$m on the lower electrodes 42. Then, the openings 54a reaching the lower electrodes 42 are formed in the insulating film 54 by use of photolithography and dry etching.

On the insulating film 54 and the lower electrodes 42, the heat generating layer 44 is formed of polysilicon in a thickness of approximately 1.0 $\mu$m by use of a reduced-pressure CVD method so as to have a specific resistance of approximately 1,000 $\Omega$·cm. When the heat generating layer 44 formed of polysilicon is doped with an impurity such as boron, phosphorus or a metal, the resistance thereof is possibly reduced and thus prevents the temperature thereof from reaching a specified level even when heat is generated. In order to avoid such an inconvenience, highly pure polysilicon and a highly clean CVD device must be used. The heat generating layer 44 is formed by use of a reduced-pressure CVD method with a highly pure mono-silane gas in the first example. Any other silicon compound or any other method may be used as long as a required level of resistance can be obtained.

On the heat generating layer 44, the upper electrodes 41 are formed by depositing tungsten into a film having a thickness of approximately 1.0 $\mu$m by use of a reduced-pressure CVD method and then patterning the film of tungsten by use of photolithography and dry etching. Then, the alignment film 56 is formed on the upper electrodes 41. For forming the alignment film 56, polyimide is coated on the upper electrodes 41 by spinning, the resultant layer of polyimide is treated with polymerization by heating, an unnecessary portion is removed, and then the resultant film is rubbed.

The glass substrate 52 is prepared by cutting glass into an appropriate size. On the surface of the glass substrate 52, the counter electrodes 51 are formed by laminating a transparent conductive film formed of ITO (indium tin oxide) by use of sputtering and then patterning the film of ITO by use of photolithography and etching. The counter electrodes 51 are arranged in rows perpendicular to the upper electrodes 41. The arranging pitch and the width of the counter electrodes 51 are set to be most suitable for writing and reading data. Then, on the counter electrodes 51, the alignment film 56′ is formed by polyimide coating by spinning followed by polymerization by heating, removal of an unnecessary portion and then rubbing.

The silicon substrate 55 and the glass substrate 52 having the above-mentioned elements thereon are opposed to each other with the upper and lower electrodes 41 and 42 being inside. The glass substrate 52 and the silicon substrate 55 are positionally aligned so as to oppose the lower electrodes 42 to the counter electrodes 51. The silicon substrate 55 and the glass substrate 52 are sealed together at a periphery thereof, and then a liquid crystal is filled therebetween to form the liquid crystal layer 53.

In the first example, the liquid crystal layer 53 is formed of an acrylic polymeric nematic liquid crystal (Ti=106° C., degree of polymerization: 150) having p-cyanobiphenyl as a mesogen radical. The polymeric nematic liquid crystal is gradually cooled from an isotropic phase while being applied with an AC voltage of 100 V and 500 Hz. Thus, the liquid crystal is put into a homeotropic structure. Then, the recording section 34 produced in this manner is diced and bonded, and then accommodated into a package.

The principle of writing and reading data in the non-volatile memory cell according to the first example will be described, hereinafter.

In the first example, a phase transition or a change in the state of the liquid crystal caused by a thermal change thereof is utilized for writing data, and a change in the dielectric constant of the liquid crystal accompanying the change in the state is utilized for reading data. In a liquid crystal such as an acrylic polymeric nematic liquid crystal having p-cyanobiphenyl as a mesogen radical or a polysiloxane polymeric smectic liquid crystal, the phase is transited into an isotropic phase by heating. By rapidly cooling thereafter, the mono-domain structure of the liquid crystal is changed into a poly-domain structure. Since the poly-domain structure can be kept for a long duration of time at room temperature, data written utilizing the above structural change can be kept for a long duration of time. When being heated in the poly-domain structure and then gradually cooled, the poly-domain structure of the liquid crystal is changed into a mono-domain structure. Since the dielectric constant of the liquid crystal is different in a mono-domain structure and in a poly-domain structure, the structure of the liquid crystal is detected by measuring the dielectric constant. Thus, the data recorded in the liquid crystal can be read out electrically. By this principle, data writing and reading is effected.

The liquid crystal is transparent in a mono-domain structure while being in opalescent in a poly-domain structure due to diffusion of light. Utilizing this feature, data can also be read out optically by emitting light such as a laser beam to the recording section 34 and then detecting the light reflected by each memory cell 43.

Instead of the acrylic polymeric nematic liquid crystal, any other type of liquid crystal may be used. The usable liquid crystals include a polymeric liquid crystal having a cholesteric liquid crystal as a mesogen radical, a polymeric liquid crystal having a smectic liquid crystal as a mesogen radical, a polymeric liquid crystal having a nematic liquid crystal as a mesogen radical, a liquid crystal having two of the above three types of liquid crystal components in one molecule, a mixture of these three types of polymeric liquid crystals, and a mixture of an identical type of liquid crystals having different mesogen radicals.

Hereinafter, a practical operation for writing, erasing and reading data in the non-volatile memory device according to the first example will be described.

Writing and erasing data

Data sent from an external device is recorded in a buffer memory in the input/output signal controlling section 31, and is written into the recording section 34 after data processing. Writing is performed by applying a pulse voltage to a portion of the heat generating layer 44 through a certain pair of upper and lower electrodes 41 and 42 and thus heating the memory cell 43 of the liquid crystal layer 53, the memory cell 43 corresponding to the above portion of the heat generating layer 44. The liquid crystal in the above memory cell 43 is heated by the application of the pulse voltage, and is rapidly cooled when the application stops. By such rapid cooling, the mono-domain structure of the liquid crystal of the memory cell 43 is changed into a poly-domain structure. In this state, data is written in the memory cell 43. Other memory cells 43 to which no data is to be written are not heated, thereby the mono-domain structure is retained. When the memory cell 43 having the data written is heated again and then pulse voltage applied to the heat generating layer 44 is gradually lowered thus to gradually cool the memory cell 43, the poly-domain structure of the liquid crystal of the memory cell 43 is changed into a mono-domain structure. In this state, the data is erased. To which memory cell 43 the data is to be written is freely selected, thereby realizing random access.

Figure 5:
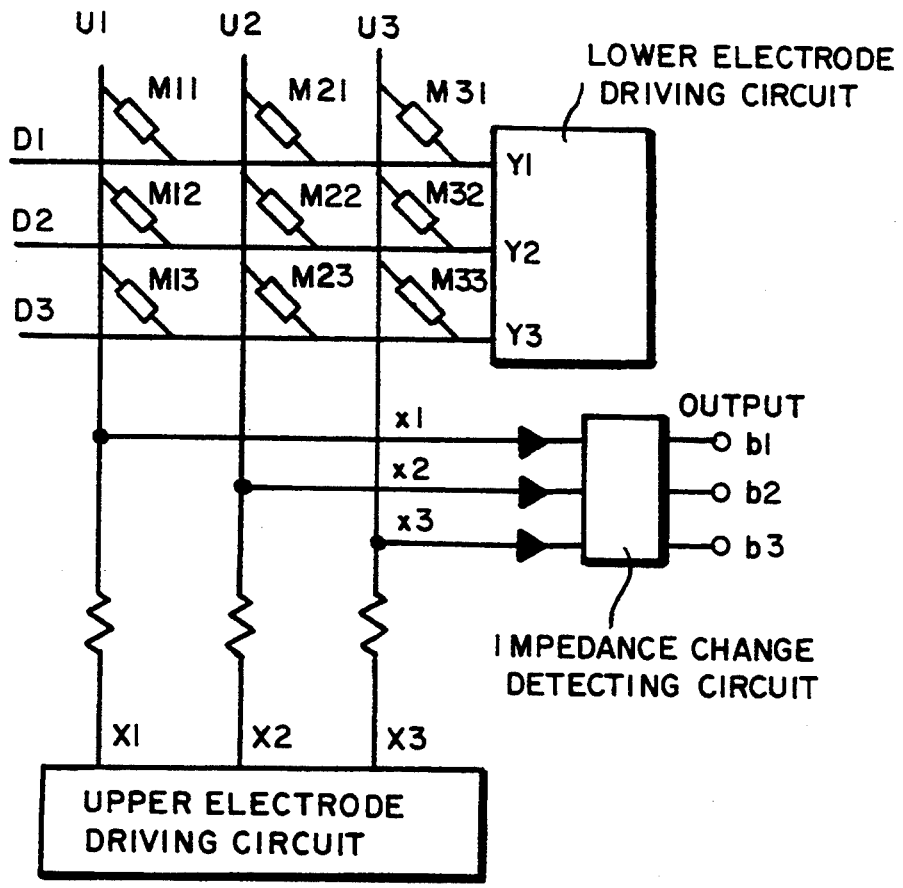
FIG. 5 is an equivalent circuit diagram of the non-volatile memory device according to the first example.
Figure 6:
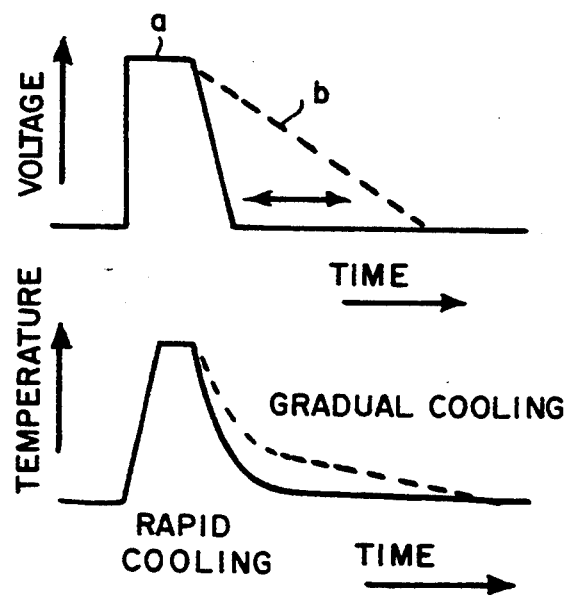
FIG. 6 is a time chart showing the relationship between the voltage applied to the liquid crystal and the temperature.

FIG. 5 shows nine memory cells formed of three lower electrodes D1 through D3 and three upper electrodes U1 through U3. For example, in order to write data into the memory cell M11, a pulse voltage of $+V1$ is applied to the lower electrode D1 by a lower electrode driving circuit of the driving circuit section 33 and a pulse voltage of $-V1$ is applied to the upper electrode U1 by an upper electrode driving circuit of the driving circuit section 33. Thus, the memory cell M11 is heated with a pulse voltage of 2 V1. In this case, since the voltages as shown by a solid line a in FIG. 6 are applied to both of the upper electrode U1 and the lower electrode D1, the liquid crystal in the memory cell M11 is once heated and then is rapidly cooled. Thus, the liquid crystal in the memory cell 43 is put into a poly-domain structure, in which state, the data is written. Pulse voltages are sequentially applied to the upper electrodes 41 and the lower electrodes 42 corresponding to the memory cells 43 to which data is to be written in this manner. Thus, data is written in the non-volatile memory device entirely.

In order to erase the data written in the memory cell M11, a pulse voltage which is gradually lowered as is shown by a dashed line b in FIG. 6 is applied to the upper electrode U1 and the lower electrode D1. By the application of such a pulse voltage, the liquid crystal in the memory cell M11 is gradually cooled and is put into a mono-domain structure. Thus, the data written in the memory cell M11 is erased. In order to erase all the data in a short period of time, pulse voltages which are gradually lowered are applied to all the upper electrodes 41 and all the lower electrodes 42.

Reading data

Since the dielectric constant is different in a mono-domain structure and a poly-domain structure as is mentioned above, data can be read out by measuring the difference in electric capacitance between a mono-domain structure and a poly-domain structure. Namely, an AC voltage is applied between the upper electrodes 41 and the counter electrodes 51 to measure the electric capacitances of the memory cells 43 in the liquid crystal layer 53. Thus, the data is read out. Practically, as is shown in FIG. 5, signals X1, X2 and X3 each having a specified waveform are respectively applied to the upper electrodes U1, U2 and U3; and signals Y1, Y2 and Y3 each having a specified waveform are respectively applied to the lower electrodes D1, D2 and D3, in the state where the counter electrodes 51 are applied with a voltage. Signals x1, x2 and x3 which are outputted to the upper electrodes U1, U2 and U3 are amplified by an amplifier, and thus a change in impedance in each signal is detected by an impedance change detecting circuit. In this way, a change in the dielectric constant of the liquid crystal in each memory cell 43 is detected. The signals x1, x2 and x3 will be referred to as the output signals, hereinafter.

Figure 7:
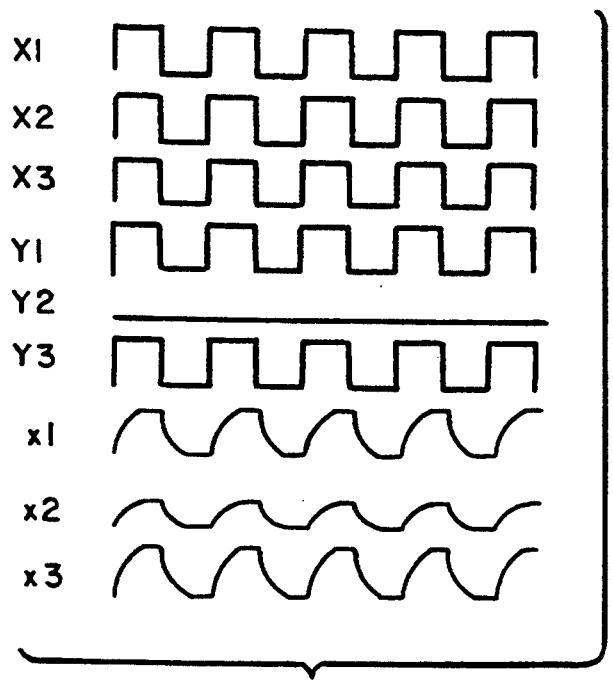
FIGS. 7 through 11 are charts each showing an example of signal waveforms used for reading data from the non-volatile memory device according to the first example.

In order to avoid crosstalk, the signals X1 through X3 and Y1 through Y3 are controlled in terms of waveform and level. FIG. 7 shows waveforms of the signals for reading data from the memory cells M12, M22 and M32 corresponding to the lower electrode D2, as an example. The signal Y2 is applied to the lower electrode D2 at a constant level, and the signals X1 through X3, Y1 and Y3 applied to the upper electrodes U1 through U3 and the lower electrodes D1 and D3 are square waveform signals synchronized with one another. The output signal x2 at the upper electrode U2 has a smaller amplitude than the other output signals x1 and x3. From this, it is detected that data is written in the memory cell M22 corresponding to the intersection of the upper electrode U2 and the lower electrode D2.

In the case when the liquid crystal material has a large anisotropy, the above detection is performed with a sufficient accuracy by applying square waveform signals having a high frequency for measuring the impedance. The square waveform signals having a high frequency allow for high speed reading. Instead of the square waveform, the signals may have a triangular, a sawtooth-like, a sinusoidal, or a pulse waveform.

Figure 8:
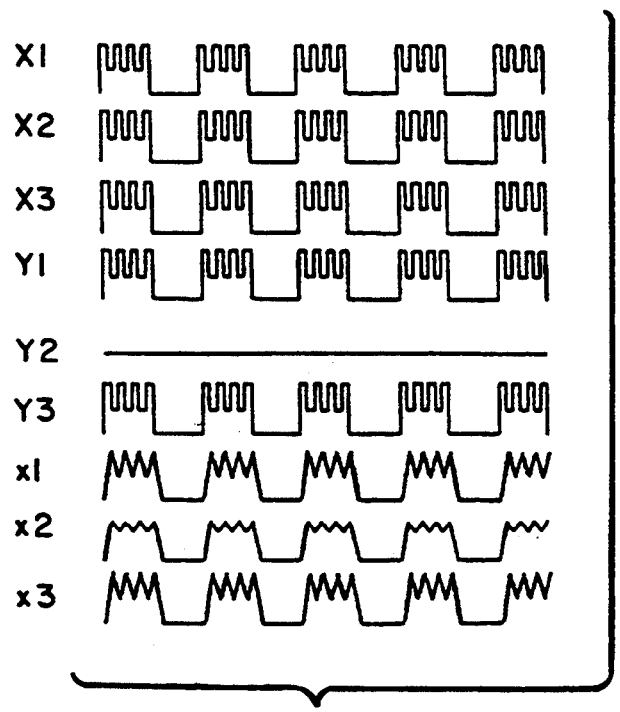

In the case when square waveform signals having a relatively low frequency are applied, a sufficient accuracy may not be obtained. In order to avoid this inconvenience, a square waveform signal superimposed with a high frequency component (FIG. 8) may be applied to upper electrodes U1 through U3 and the lower electrodes D1 and D3. In this case also, the signal Y2 is applied to the lower electrode D2 at a constant level. For reading data, the high frequency components of the output signals x1 through x3 are used instead of the square waveforms thereof. Practically, the data is read out by detecting the difference in amplitude between the high frequency component of the output signal x2 and those of the other output signals x1 and x3.

A square waveform signal superimposed with a high frequency component can also be used in the case when the dependency of the liquid crystal material on the frequency is changed. For example, in the case when the material which is changed in dielectric constant, resistivity and other properties at a certain frequency in accordance with a change in the alignment state is used, the component of the certain frequency is superimposed on the square waveform signal. Thus, a change in the alignment state is accurately detected to guarantee accurate reading of the data.

Figure 9:
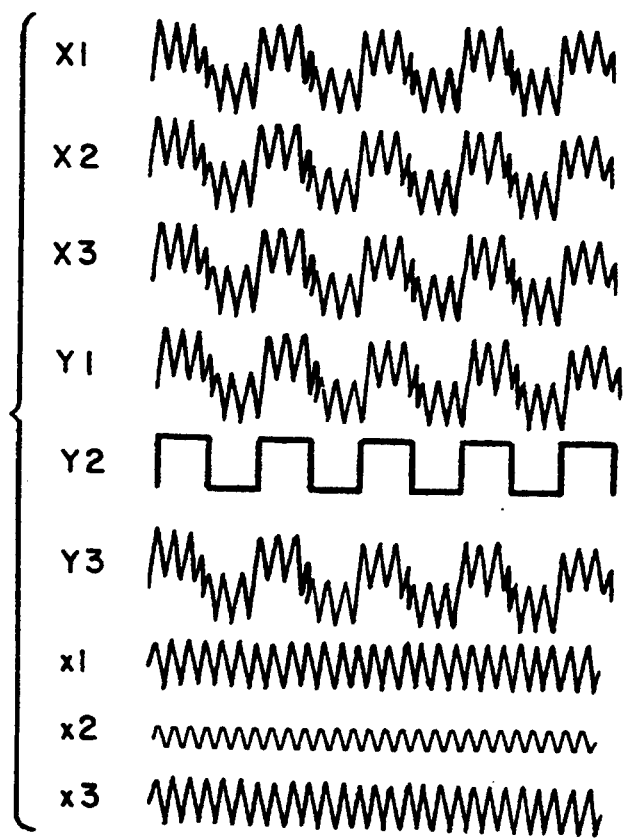
Figure 10:
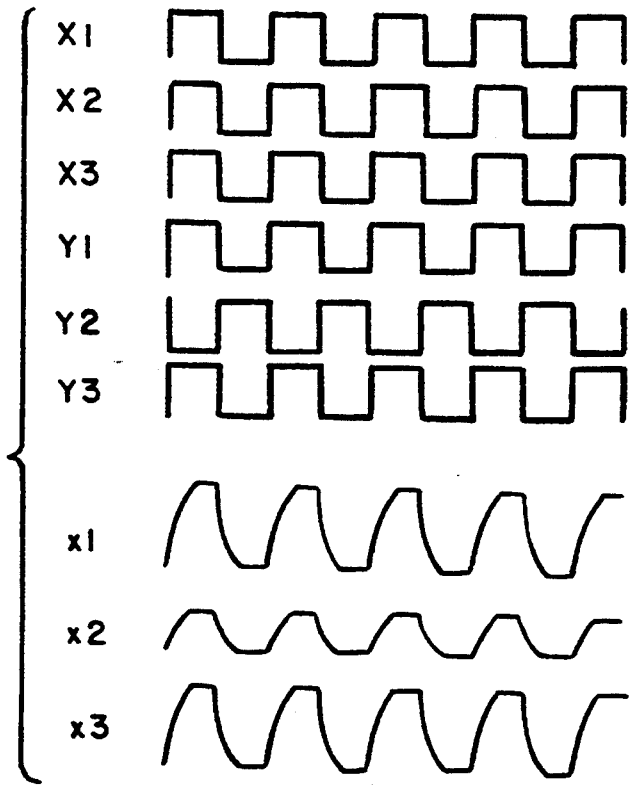

In FIG. 9, signals each superimposed with a high frequency component are applied to all the upper electrodes and all the lower electrodes except for the lower electrode D2 corresponding to the memory cell M12 from which data is to be read out. To the lower electrode D2, a square waveform signal without a high frequency component is applied. Thus, the output signals x1 through x3 are formed of only high frequency components, thereby simplifying the construction of the impedance change detecting circuit and the construction of a signal generating circuit. It is also possible to apply a square waveform signal to the lower electrode D2 from which data is to be read out and apply signals having reverse square waveforms thereto to the other electrodes U1 through U3, D1 and D3 (FIG. 10). In this case, a difference in amplitude between the output signal x2 and the other output signals x1 and x3 is enlarged, thereby guaranteeing more accurate reading of the data.

Figure 11:
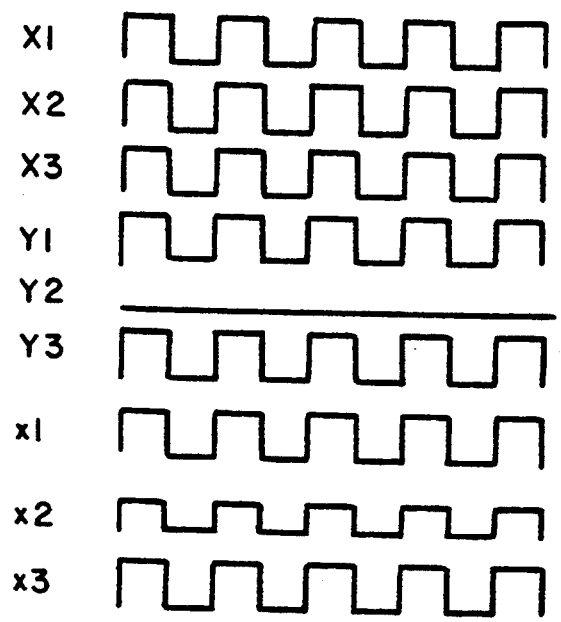

The waveform of the output signals x1 through x3 significantly differs depending on the properties of the liquid crystal material. Such a difference is not a problem as long as the data recorded by the change in the alignment state is detected as a difference in impedance. For example, when a liquid crystal material which changes in conductivity in accordance with a change in the alignment state is used, the output signals x1 through x3 each having a square waveform shown in FIG. 11 are applied.

No voltage level is indicated in FIGS. 7 through 11. In the case when a DC component of a voltage has an adverse affect on the liquid crystal, an appropriate voltage is selected so as to avoid the application of the DC component on the liquid crystal. Application of only a positive voltage or only a negative voltage is realized by selecting an appropriate voltage. The voltage to be applied for reading data is generally set to a low level, for example, 0 to 30 V in order to avoid any change of a fixed alignment state of the liquid crystal. Practically, a voltage of 10 V or lower is desirable for stable recording.

As is mentioned above, the liquid crystal is transparent in a mono-domain structure, but is opalescent in a poly-domain structure due to diffusion of light. Accordingly, data can also be read out by emitting light such as a laser beam to the recording section 34 and then detecting the light reflected by each memory cell 43.

Figure 12:
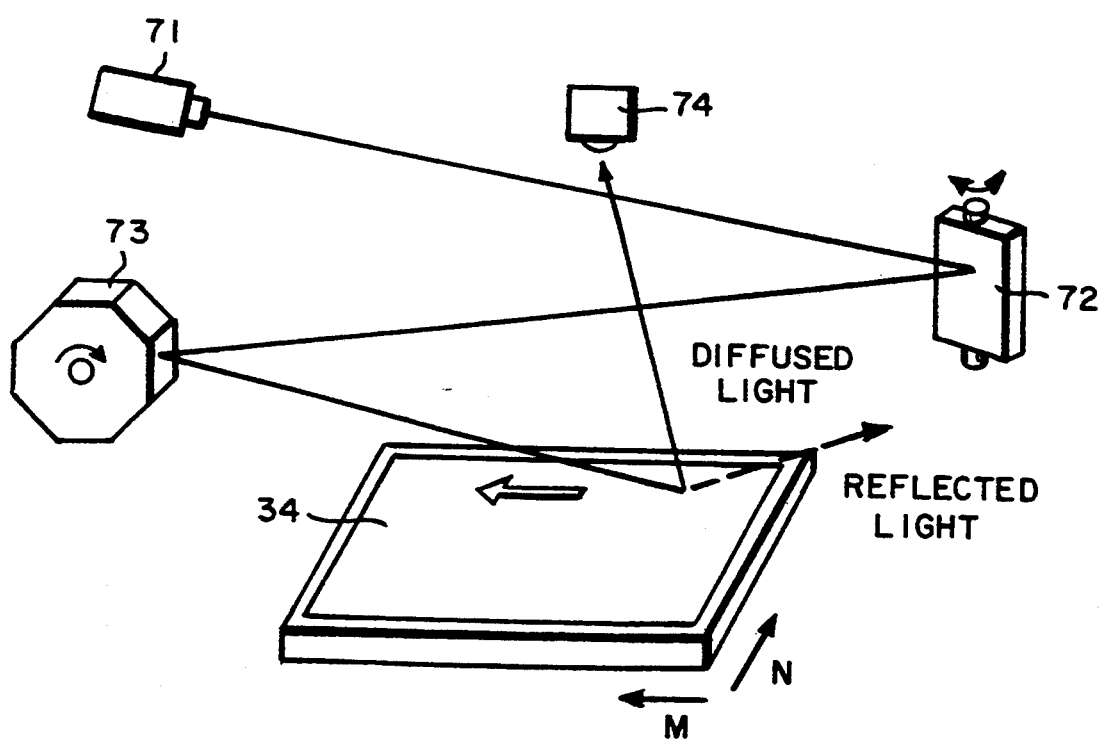
FIG. 12 is a schematic view of an optical reading apparatus used for reading data from the non-volatile memory device according to the first example.

FIG. 12 is a schematic view of an optical reading apparatus. A laser beam emitted from a laser 71 is emitted to the recording section 34 of the non-volatile memory device according to the first example through a movable mirror 72 and a polygon mirror 73. The movable mirror 72 for receiving the laser beam emitted from the laser 71 is rotated in such a direction as to move the laser beam to scan the recording section 34 in the direction of N. The polygon mirror 73 for receiving the laser beam reflected by the movable mirror 72 is rotated in such a direction as to move the laser beam to scan the recording section 34 in the direction of M. By rotating the movable mirror 72 and the polygon mirror 73 in synchronization, an entire surface of the recording section 34 is scanned by the laser beam.

The laser beam emitted to the recording section 34 is reflected in different directions depending on the alignment state of the liquid crystal in each memory cell of the recording section 34. When the liquid crystal is opalescent in a poly-domain structure, the laser beam is diffused. When the liquid crystal is transparent in a mono-domain structure, the laser beam is transmitted through the liquid crystal layer 53 and is reflected by the surface of the silicon substrate 55. A photosensor 74 provided as opposed to the recording section 34 does not receive the laser beam reflected by the silicon substrate 55 but receives only the laser beam diffused by the opalescent liquid crystal. When the laser beam is received by the photosensor 74, by which memory cell the laser beam is diffused is specified and thus the data written in this memory cell 43 is read out.

As the laser 71, a semiconductor laser which is generally used for reading optical memory or a laser having a low optical output is used so that the temperature of the liquid crystal will not be increased by the emission of the laser beam and so that a phase transition will not occur in accompaniment with the increase of the temperature.

The circuit sections 31 through 33 provided in a periphery of the non-volatile memory device are not limited to ICs, but other circuits or other elements may be used as long as they can be mounted on the single crystalline silicon substrate 55. However, when the single crystalline silicon substrate 55 is used for the recording section 34, the use of ICs is advantageous in that mounting is easy and the size of the memory cell is reduced.

In the non-volatile memory device according to the first example, data writing to and data reading from a memory medium are performed by static electric control. Such an operation eliminates a rotating mechanism or a moving mechanism which are required for an optical disc or a magnetic disc. Accordingly, the construction of the memory device is simplified to reduce the size thereof, and the production cost is lowered. Moreover, since complicated components such as a laser pickup or a head and precise structures are not necessary, it does not occur that the memory device is defected by vibration, impact or dust. As a result, the stability of keeping data is significantly improved.

The non-volatile memory device, which has a simpler construction than an IC non-volatile memory device, is easy to produce. Further, by applying the fine patterning technology used for ICs, the memory cells can be more microscopic. Accordingly, a high density, high capacity non-volatile memory device can be produced. Data reading can be performed not only electrically but also optically.

EXAMPLE 2

A non-volatile memory device according to a second example of the present invention has an identical construction with that of the first example except for the material of the liquid crystal layer 53. According to the second example, the liquid crystal layer 53 is formed of a ferroelectric polymeric liquid crystal having a ferroelectric liquid crystal introduced into a side chain. Such a ferroelectric polymeric liquid crystal includes, for example, a biphenyl ferroelectric liquid crystal as a mesogen radical as shown by Structural Formula 1.

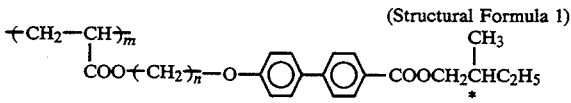
(Structural Formula 1)

A ferroelectric polymeric liquid crystal having a ferroelectric liquid crystal introduced into a side chain is obtained by introducing a side chain formed of a mesogen radical added with a chiral structure at an end thereof to a polymeric main chain. In the case when an appropriate ferroelectric liquid crystal material is employed for the side chain and an appropriate spacer is put between the side chain and the polymeric main chain, the ferroelectric liquid crystal in the side chain shows a behavior similar to that of a low molecular ferroelectric liquid crystal, namely, expresses ferroelectricity.

The ferroelectric liquid crystal is bistable and is known for a high speed response. Accordingly, the ferroelectric polymeric liquid crystal including the ferroelectric liquid crystal also has a high speed response. The above-mentioned features of the ferroelectric polymeric liquid crystal are explicitly described in "S. Uchida, K. Morita, K. Miyoshi, K. Hashimoto, K. Kawasaki, Mol. Cryst. Liq. Cryst. 1988, 155, 93", "T. Kitazume, T. Ohnogi, K. Ito, J. Am. Chem. Soc, 1990, 112, 6608", "T. Sekiya, K. Kawasaki, Kohbunshi (Polymer), 1991, 40, July, 454", and "T. Kitazume, Kinohzairyo (Functional Material), 1990, Sept., 43".

Figure 13:
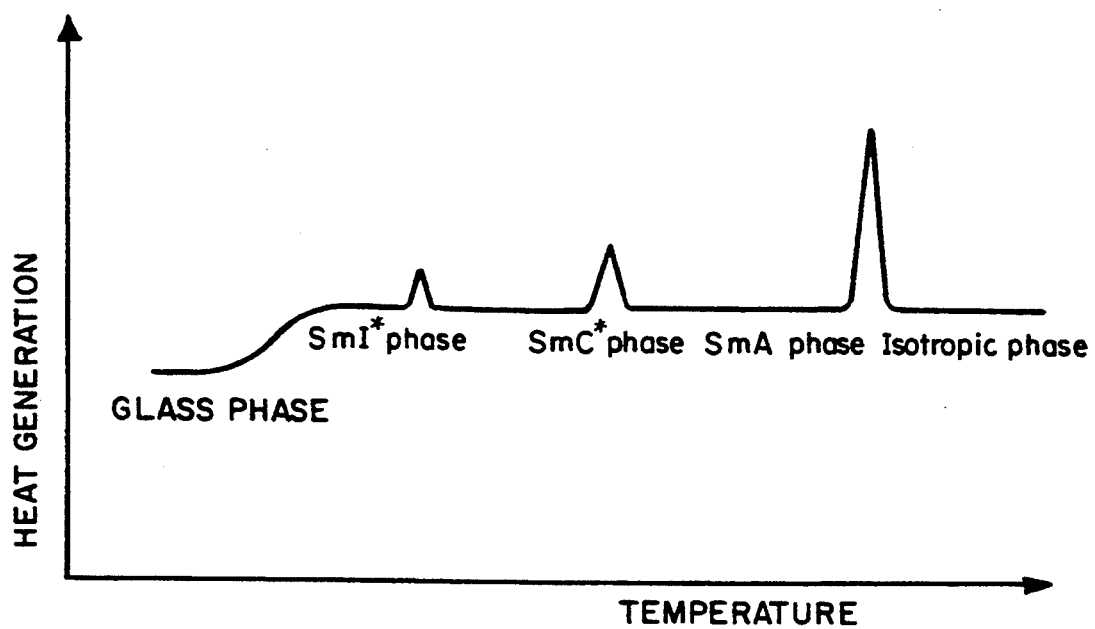
FIG. 13 is a graph showing a property of a ferroelectric liquid crystal used in a non-volatile memory device according a second example of the present invention.

FIG. 13 shows a DSC (differential scanning calorimetry) curve of the ferroelectric polymeric liquid crystal having the biphenyl ferroelectric liquid crystal shown in Structural Formula 1. As is apparent from FIG. 13, the phase of this ferroelectric liquid crystal is transited from a glass phase, to a chiral SmI (or chiral SmF) phase, to a chiral SmC phase, to an SmA phase, and to an isotropic phase. In a low temperature range corresponding to room temperature, the liquid crystal is in a glass phase. As the temperature is raised, the phase of the liquid crystal is transited to a chiral SmI phase and then to a chiral SmC phase. The chiral SmC phase is kept for a long duration of time. For writing data in a certain memory cell 43, the temperature of this memory cell 43 is raised to put the liquid crystal therein into a chiral SmC phase, and an electric field is applied to the liquid crystal in the memory cell 43. Then, the alignment state thereof is changed. Thus, the data is written in the above memory cell 43.

In order to raise the temperature of the ferroelectric polymeric liquid crystal, a voltage is applied between the upper electrode 41 and the lower electrode 42, thereby generating heat in a portion of the heat generating layer 44 corresponding to the memory cell 43 to which data is to be written. When the ferroelectric polymeric liquid crystal in the memory cell 43 is put into a chiral SmC phase, a voltage of, for example, 15 V is applied between the counter electrode 51 and the upper electrode 41 so as to apply an electric field to the memory cell 43, thereby changing the alignment state of the ferroelectric polymeric liquid crystal. Thus, the alignment state of the liquid crystal applied with the electric field differs from that of the remaining liquid crystal applied with no electric field. Utilizing the difference in the alignment state, "ON" and "OFF", namely, "1" and "0" are written. Data writing is performed by sequentially heating the intersections of the upper electrodes 41 and the lower electrodes 42 and then applying a voltage between the counter electrodes 51 and the upper electrodes 41, thereby applying an electric field to the liquid crystal in memory cell 43. Accordingly, data writing is performed with a higher efficiency than the case when an electric field is applied to each memory cell to which data is to be written. Depending on the liquid crystal material, the alignment state can be changed by applying a magnetic field instead of an electric field.

After the data is written, the voltage application between the counter electrodes 51 and the upper electrodes 41 is stopped to rapidly cool the ferroelectric polymeric liquid crystal, thereby transiting the phase thereof to a glass phase. Thus, the alignment state of the liquid crystal is fixed. Since this glass phase is kept for a long duration of time, the data written in the liquid crystal is kept for a long duration of time.

The data is read out by detecting a difference in dielectric constant made by the change in the alignment state. The dielectric constant is different depending on the alignment state of the ferroelectric polymeric liquid crystal. By electrically detecting the difference, the data is read out. Owing to a high dielectric constant of the ferroelectric polymeric liquid crystal, a large value can be detected. In other words, reading can be done with a high S/N ratio, thereby improving reading accuracy.

Data can also be read out by detecting a difference in the directions of spontaneous polarization made by a change in the alignment state of the ferroelectric polymeric liquid crystal. The spontaneous polarization supplies a voltage between the upper electrode 41 and the counter electrode 51. Since the sign of such a voltage is inverted by a change in the alignment state, the data can be detected by electrically measuring the voltage. Owing to a high degree of spontaneous polarization of the ferroelectric polymeric liquid crystal, a large value can be detected. In other words, reading can be done with a high S/N ratio, thereby improving reading accuracy.

Figure 14:
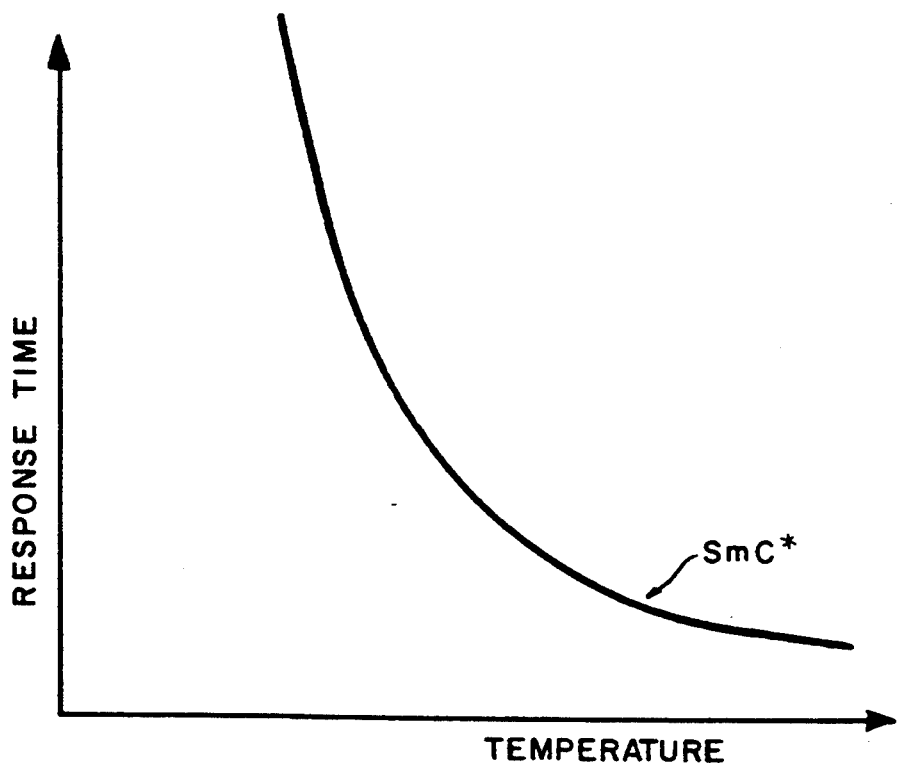
FIG. 14 is a graph showing the relationship between the temperature of the ferroelectric liquid crystal and the response time.

FIG. 14 shows the dependency of the response time on the temperature of the ferroelectric polymeric liquid crystal. The response time suddenly shortens when the phase is transited into a chiral SmC phase. This fact indicates that data writing in the state where the ferroelectric polymeric liquid crystal is raised in temperature to be in a chiral SmC phase is performed at a high speed owing to the short response time. After the data writing is finished, the temperature of the ferroelectric polymeric liquid crystal is lowered.

In the case when the data writing is performed at a high speed, the amount of heat transmitted from the memory cell 43 to which data is to be written to the memory cell 43 to which data is not to be written during the data writing is significantly reduced. Accordingly, thermal adverse affect such as thermal crosstalk is reliably prevented, thus improving writing accuracy.

The ferroelectric polymeric liquid crystal is not limited to the one shown in Structural Formula 1 but may be formed of a fluorine ferroelectric polymeric liquid crystal shown in Structural Formula 2.

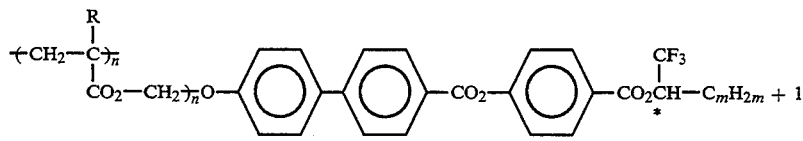

(Structural Formula 2)

In the second example, the ferroelectric polymeric liquid crystal is raised in temperature to be in a chiral SmC phase for data writing. It is also possible to raise the ferroelectric polymeric liquid crystal in temperature to be in an isotropic phase (FIG. 13) and then apply a voltage to the liquid crystal for data writing.

In the non-volatile memory device according to the second example, a ferroelectric polymeric liquid crystal is used as a memory medium. Owing to the features of the ferroelectric polymeric liquid crystal, data writing can be performed at a high speed, thermal crosstalk is reliably prevented, and data reading is performed easily and highly accurately.

EXAMPLE 3

In a third example according to the present invention, the liquid crystal layer 53 is formed of a composite of a polymer and a liquid crystal compound. Such a composite is prepared by mixing 2-ethyl-hexylacrylate (monomer), urethane acrylate oligomer, and a cyanobiphenyl type liquid crystal mixture in a polymerization ratio of 12:18:70 and then uniformly mixing the resultant mixture and a photopolymerization initiator. As the liquid crystal mixture, for example, a material mainly including 4-decyl-hexanoylbiphenyl is used. The resultant composite is filled between the silicon substrate 55 and the glass substrate 52. By emitting ultraviolet rays to this composite, a polymeric phase and a liquid crystal phase are separated from each other to form a PDLC (polymer dispersed liquid crystal).

In the third example, an acrylic polymer is used as the material for forming a polymeric phase, other polymeric materials such as PMMA (poly methyl metacrylate) may also be used. Instead of a cyanobiphenyl type liquid crystal mixture used as the liquid crystal material in the third example, any other material may also be used as long as the material forms a PDLC. As the liquid crystal materials, those mentioned in "A. Sasaki, Ekisho Electronics no Kiso to Ohyo (Basics and Applications of Liquid Crystal Electronics), published by Ohmu-sha" are used. Instead of emitting ultraviolet rays to the composite filled between the substrates, any other method may be used. The usable methods include a method of curing the composite filled between the substrates by heating, and a method of dissolving the composite in a solvent and removing the solvent after filling the composite between the substrates.

In the PDLC containing the cyanobiphenyl type liquid crystal mixture, molecules are aligned when being applied with an electric field. When the liquid crystal mixture is heated to a temperature at which the nematic—isotropic phase transition occurs or higher and then cooled, the molecules are put into a isotropic phase. Since the isotropic phase is maintained at room temperature for a long duration of time, data is kept for a long duration of time. The dielectric constant of the liquid crystal is different in an aligned phase and an isotropic phase, the data is read out by detecting a change in impedance accompanying a change in the dielectric constant. Since the liquid crystal is opalescent in an isotropic phase while being transparent in an aligned phase, the data can also be detected optically as is mentioned above.

Accordingly, in the case when a composite of a polymer and a liquid crystal compound is used, an alignment film is not necessary. Therefore, there is no adverse affect of static electricity generated by the formation of the alignment film, thereby guaranteeing stable data writing.

EXAMPLE 4

In a fourth example according to the present invention, the liquid crystal layer 53 is formed of a conductive polymeric liquid crystal. The conductive polymeric liquid crystal used as the liquid crystal includes a charge-transfer complex as a conductance supplying radical B, an ester liquid crystal as a mesogen radical A, and an acrylic main chain. The charge-transfer complex has phenanthrene as an electron donor and iodine as an electron acceptor. Such a conductive polymeric liquid crystal is filled between the silicon substrate 55 and the glass substrate 52. The conductive polymeric liquid crystal is gradually cooled from an isotropic phase while applying an AC voltage of 100 V and 500 Hz.

Thus, the liquid crystal is put into a homogeneous structure. The recording section 34 produced in this manner is diced and bonded, and then accommodated into a package.

In the case when such a conductive polymeric liquid crystal is used as the liquid crystal material, a phase transition or other change in the state of the liquid crystal caused by a thermal change thereof is utilized for writing data, and a change in the dielectric constant accompanying the change in the state is utilized for reading data.

As is shown in FIG. 15, a conductive polymeric liquid crystal includes a polymeric main chain P, a mesogen radical A (liquid crystal), a conductance supplying radical B and spacers S. The mesogen radical A is connected to the polymeric main chain P through the spacer S. The conductance supplying radical B is connected to the mesogen radical A through another spacer S.

The polymeric main chain P is formed of an acrylic polymer, a silicon polymer, a meta acrylic polymer or a compound thereof. The mesogen radical A fixes an end of the conductance supplying radical B, and further influences the temperature at which a phase transition occurs and the response speed. The mesogen radical A is formed of a liquid crystal compound including azomethyl, azoxy, biphenyl-type liquid crystals and the like. The mesogen radicals A are aligned when being applied with an electric field while being cooled from an isotropic phase, thereby forcibly arranging the conductance supplying radicals B in order. The conductance supplying radical B is a charge-transfer complex, namely, has conductance, only when being arranged in order, in the direction of the arrangement. This feature is used for data writing. The spacers S, which are formed of methylene chains or the like, determine the degree of freedom of the mesogen radical A. The length of the molecule of the spacer S influences important properties of the memory device such as the response speed. Accordingly, it is important to employ a conductive liquid crystal having such molecules as facilitate the alignment of the mesogen radicals A and the arrangement of the conductance supplying radicals B. The spacers S may be eliminated.

FIG. 16A schematically shows a conductive polymeric liquid crystal in the state where the mesogen radicals A are aligned and the conductance supplying radicals B are arranged in order. The alignment of the mesogen radicals A forcibly arranges the conductance supplying radicals B in order. Accordingly, the current flows in the direction of the arrows (or in the opposite direction) through the adjacent conductance supplying radicals B, thereby turning the liquid crystal conductive.

FIG. 16B schematically shows a conductive polymeric liquid crystal in the state where the mesogen radicals A are not aligned and the conductance supplying radicals B are not arranged in order. Accordingly, the liquid crystal does not turned conductive and has a high electrical resistance.

Such a conductive polymeric liquid crystal is filled between the silicon substrate 55 and the glass substrate 52. The liquid crystal is switched between the conductive state and the highly resistive state by controlling the current flowing for heating the liquid crystal between the upper electrode 41 and the lower electrode 42 and the voltage applied for writing data between the upper electrode 41 and the counter electrode 51. Thus, data writing and erasing can be performed.

Figure 17:
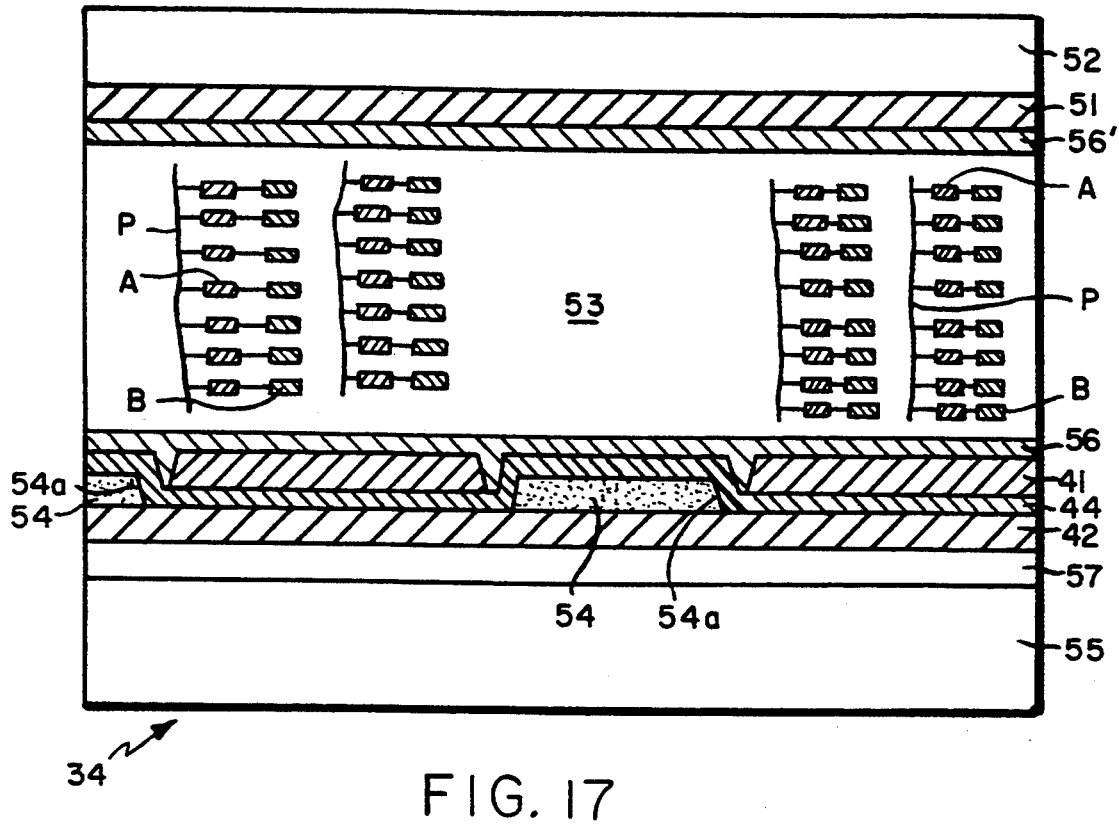
FIG. 17 is a view of an essential part of the non-volatile memory device according to the fourth example in the state where the mesogen radicals and the charge-transfer complexes are aligned.
Figure 18A:
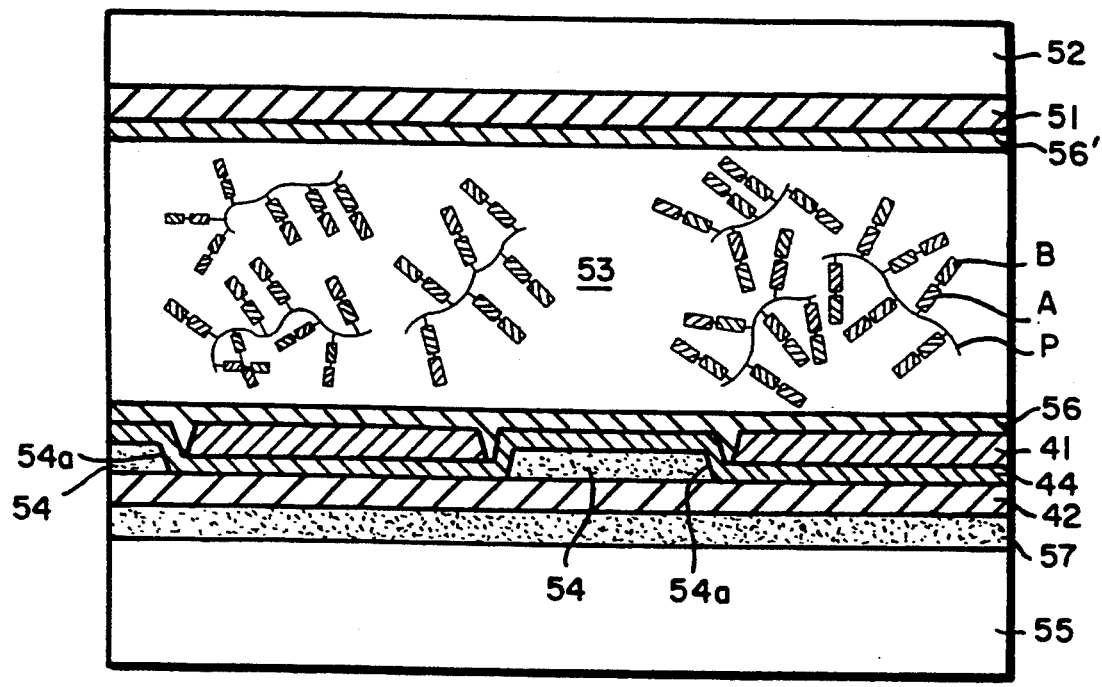
FIGS. 18A and 18B are views of an essential part of the non-volatile memory device according to the fourth example in the state where neither the mesogen radicals nor the charge-transfer complexes are aligned.
Figure 18B:
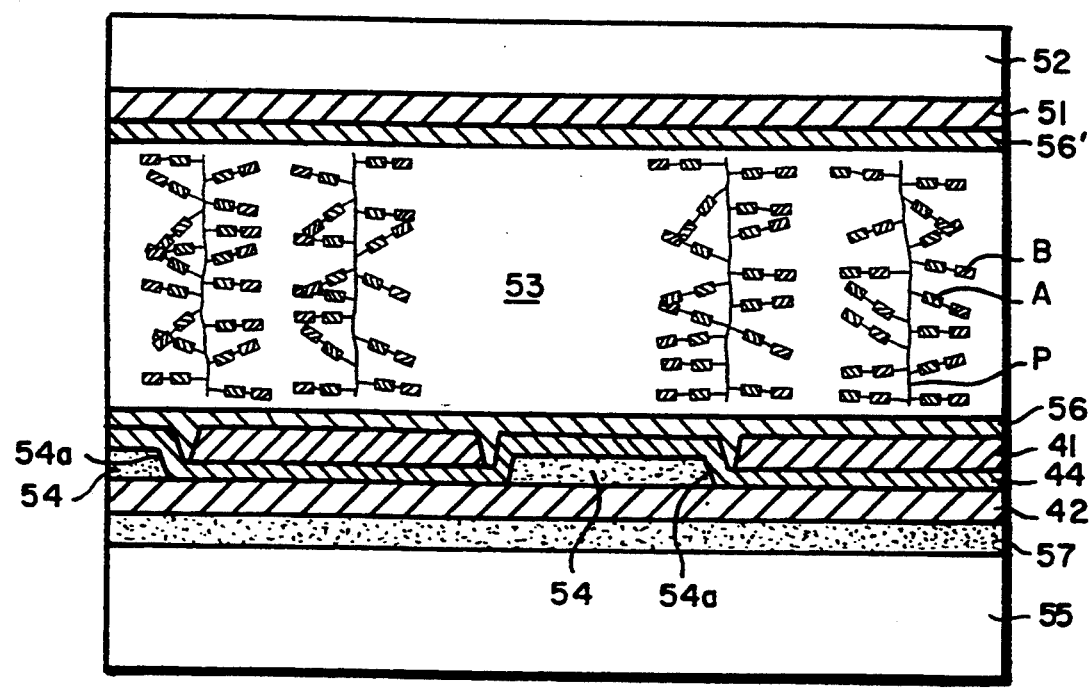

A principle of writing and reading will be described with reference to FIGS. 17, 18A and 18B. The conductive polymeric liquid crystal is heated to be in an isotropic phase, is applied with a voltage, and then is rapidly cooled. Thus, the mesogen radicals A are aligned. The conductance supplying radicals B are forcibly arranged in order by the alignment of the mesogen radicals A. Since electric charges can move through the adjacent conductance supplying radicals B, the liquid crystal turns conductive as is shown in FIG. 17. In the case when a liquid crystal having a negative dielectric anisotropy is used as the mesogen radicals A, the mesogen radicals A are in the homogeneous structure. The conductance supplying radicals B are forcibly put into a homogeneous structure by the mesogen radicals A. When the conductance supplying radicals B are arranged in order, the liquid crystal is conductive in a direction of the arrangement. In FIG. 17, the liquid crystal is conductive between the counter electrodes 51 and the upper electrodes 41.

On the other hand, when the conductive polymeric liquid crystal is rapidly cooled from an isotropic phase without applying a voltage, the mesogen radicals A are not aligned, and thus the conductance supplying radicals B are not arranged in order. Accordingly, the liquid crystal has a high electrical resistance with no conductance as is shown in FIGS. 18A and 18B. In FIG. 18A, the polymeric main chains P, the mesogen radicals A, and the conductance supplying radicals B are all in disorder. In FIG. 18B, the polymeric main chains P are arranged in order, but the mesogen radicals A are not aligned and thus the conductance supplying radicals B are not arranged in order. Accordingly, the liquid crystal does not turn conductive. In FIGS. 18A and 18B, the liquid crystal has a high electrical resistance between the counter electrodes 51 and the upper electrodes 41. Whether the liquid crystal is put into the state of FIG. 18A or FIG. 18B depends on various elements such as heating conditions, alignment conditions by the alignment films 56 and 56', and the type of the conductive polymeric liquid crystal. It is desirable to select such elements as realize the state of FIG. 18B in order to obtain a high speed response.

The conductance and the electrical resistance of the liquid crystal are judged by applying an AC or a DC voltage between the upper electrode 41 and the counter electrode 51 to measure the impedance or the conductivity of the liquid crystal.

A practical operation for writing and reading data of the memory device using a conductive polymeric liquid crystal as the memory medium will be described.

Data writing and erasing

Data writing is performed in the following manner. A voltage is applied between the upper electrode 41 and the lower electrode 42 as a heating voltage so that a specified voltage is applied to a portion of the heat generating layer 44 corresponding to the memory cell 43 to which data is to be written. Thus, the portion of the heat Generating layer 44 is heated, thereby heating the liquid crystal in the memory cell 43. When the liquid crystal in the memory cell 43 is put into an isotropic phase, a voltage is applied between the upper electrode 41 and the lower electrode 42 as a writing voltage while the application of the heating voltage is stopped, thereby rapidly cooling the liquid crystal. Thus, the liquid crystal turns conductive. The specific resistance of the liquid crystal is: $\rho = 10^6$ to $10^8$ Ω·cm.

On the other hand, when the liquid crystal which is in an isotropic phase is rapidly cooled without applying a writing voltage, the liquid crystal obtains a high electrical resistance. The specific resistance of the liquid crystal at this point is: $\rho = 10^{12}$ to $10^{13}$ Ω·cm.

The conductive state and the highly resistive state can be switched at any time. Either state may be recorded as "ON". Since the memory cell 43 to which data is to be written can freely be selected, random access is possible.

Data reading

An AC or an DC voltage is applied between the upper electrode 41 and the counter electrode 51, thereby measuring the conductivity or the impedance of the liquid crystal in the memory cell 43 from which data is to be read out. The specific resistance of the liquid crystal is significantly different between the case when the mesogen radicals A are not aligned and the conductance supplying radicals B are not arranged in order and the case when the mesogen radicals A are aligned but the conductance supplying radicals B are not arranged in order. Accordingly, data can be read out by detecting the difference in the conductivity.

As the conductive polymeric liquid crystal, the ones disclosed in Japanese Laid-Open Patent Publication No. 59-59705 may be used. The conductive polymeric liquid crystal is not limited to one having a charge-transfer complex as the conductance supplying radical B, but may be any other compound as long as the compound has a conductivity which is changed in accordance with a change in the alignment state or a phase transition. For example, a polymer using a conjugate system of polyacetylene type main chains and the like, or an organic conductive polymer including a composite of such a polymer and a metal may be employed as the conductive polymeric liquid crystal.

The use of such a conductive polymeric liquid crystal as an alignment film further enlarges the ON/OFF ratio of a read-out signal, thereby enlarging the S/N ratio of the read-out signal. As a result, the reading accuracy is improved. The enlargement of the ON/OFF ratio also offers an advantage that the amplification factor of an amplifier for amplifying the readout signal can be low.

Figure 19:
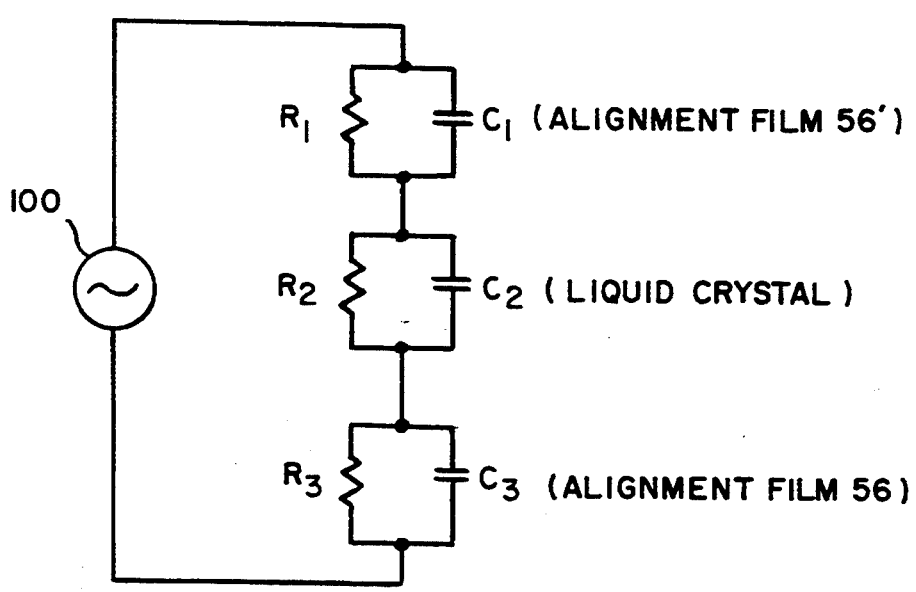
FIG. 19 is an equivalent circuit diagram of the non-volatile memory device of the fourth example.

In order to explain why the use of a conductive polymeric liquid crystal as an alignment film enlarges the ON/OFF ratio (actually, OFF/ON ratio) of the read-out signal in correlation with the ON/OFF state of the memory cell 43 will be described, with reference to FIG. 19.

For data reading, an AC voltage is applied as a reading voltage between the counter electrode 51 and the upper electrode 41 from an AC power source 100. In FIG. 19, $C_1$ denotes the capacitance of the alignment film 56'; $C_2$ denotes the capacitance of the liquid crystal; and $C_3$ denotes the capacitance of the alignment film 56. $R_1$ denotes the resistance of the alignment film 56'; $R_2$ denotes the resistance of the liquid crystal; and $R_3$ denotes the resistance of the alignment film 56.

Where the area of the memory cell 43 is:

$S = 2 \mu m \times 2 \mu m = 4 \times 10^{-12} m^2$;

the thickness of each alignment film 56 or 56' formed of polyimide (dielectrics) is:

$t = 0.02 \mu m = 2 \times 10^{-8} m$;

the thickness of the liquid crystal layer 53 is:

$L = 1.0 \mu m = 1 \times 10^{-6} m$;

the specific dielectric constant of polyimide is:

$\epsilon_S = 3.3$;

the specific dielectric constant of the liquid crystal is:

$\epsilon_S = 5.0$;

the specific resistance of polyimide is:

$\rho = 10^{16}$ Ω·cm;

the specific resistance of the liquid crystal at OFF (in the non-conductive state) is:

$\rho = 10^{12}$ Ω·cm; and the specific resistance of the liquid crystal at ON (in the conductive state) is:

$\rho = 10^6$ Ω·cm;

the capacitance $C_i$ (i=1, 2, 3) is expressed by Formula (1):

$$C_i = \epsilon_0 \epsilon_S S / t \qquad (1)$$

where the specific dielectric constant in vacuum is:

$\epsilon_0 = 8.9 \times 10^{-12}$

By substituting the above values into Formula (1), $C_1 = C_3 = 5.9 \times 10^{-15} [F]$, and $C_2 = 1.8 \times 10^{-16} [F]$.

Capacitive reactances $R_{C1}$, $R_{C2}$ and $R_{C3}$ with respect to the capacitances $C_1$, $C_2$ and $C_3$ are expressed by Formula (2):

$$\begin{aligned} R_{C1} &= 1/(2\pi f C_1) \\ R_{C2} &= 1/(2\pi f C_2) \\ R_{C3} &= 1/(2\pi f C_3) \end{aligned} \qquad (2)$$

where f is the frequency of the reading voltage applied between the counter electrode 51 and the upper electrode 41 from the AC power source 100. In the fourth example, an AC voltage of 60 Hz is used as the reading voltage.

By substituting the values of $C_1$, $C_2$ and $C_3$ into Formula (2), the capacitive reactances $R_{C1} = R_{C3} = 5.0 \times 10^{11}$ Ω, and $R_{C2} = 1.5 \times 10^{13}$ Ω.

The resistance $R_i$ is expressed by Formula (3):
$$R_i = \rho \cdot L / S \qquad (3)$$

By substituting the above values into Formula (3), $R_1 = R_3 = 5.0 \times 10^{17}$ Ω.

The values of $R_2$ at OFF and ON are:

$R_{OFF2} = 2.5 \times 10^{15}$ Ω, and $$R_{ON2} = 2.5 \times 10^4 \, \Omega.$$

From the above results, the resistance $R_{OFF}$ obtained when the memory cell 43 is OFF and the resistance $R_{ON}$ obtained when the memory cell 43 is ON are expressed by Formulas (4) and (5):

$$R_{OFF} = R_1 \cdot R_{C1}/(R_1 + R_{C1}) + R_{OFF2} \cdot R_{C2}/ (R_{OFF2} + R_{C2}) + R_3 \cdot R_{C3}/(R_3 + R_{C3}) = 2.0 \times 10^{13} \, \Omega \quad (4)$$

$$R_{ON} = R_1 \cdot R_{C1}/(R_1 + R_{C1}) + R_{ON2} \cdot R_{C2}/ (R_{ON2} + R_{C2}) + R_3 \cdot R_{C3}/(R_3 + R_{C3}) = 1.3 \times 10^{12} \, \Omega \quad (5)$$

From Formulas (4) and (5), the ratio of the resistances (1/conductivity ratio) in correlation with the OFF/ON state of the memory cell 43 is expressed by Formula (6):

$$R_{OFF}/R_{ON} = 15 \quad (6)$$

As is apparent from Formula (6), since the resistance ratio in correlation with the OFF/ON state of the memory cell 43 can be enlarged according to the fourth example, the OFF/ON ratio of the read-out signal can be large. As a result, the reading accuracy can be improved.

Hereinafter, the OFF/ON ratio of the read-out signal in the case when a conductive liquid crystal is used as the alignment films 56 and 56′ will be described.

Conductive polyimide including a small amount of carbon mixed therein is used to form the alignment films 56 and 56′ each having a specific resistance $\rho = 10^3 \, \Omega$. From Formula (3), $R_1 = R_3 = 5 \times 10^4 \, \Omega$. From Formulas (4) and (5), $$R_{OFFF} = 1.5 \times 10^{13} \, \Omega, \text{ and}$$

$$R_{ON} = 1.25 \times 10^5 \, \Omega.$$

Accordingly, the resistance ratio is: $R_{OFF}/R_{ON} = 1.2 \times 10^8$. As apparent from this value, the OFF/ON ratio of the read-out signal can be much larger than the ON/OFF ratio which is obtained in the case when a non-conductive liquid crystal is used. Therefore, the reading accuracy can be improved.

As is mentioned above, the non-volatile memory device according to the fourth example, the ON/OFF ratio of a read out signal is large, resulting in an improvement of writing accuracy.

EXAMPLE 5

Figure 20:
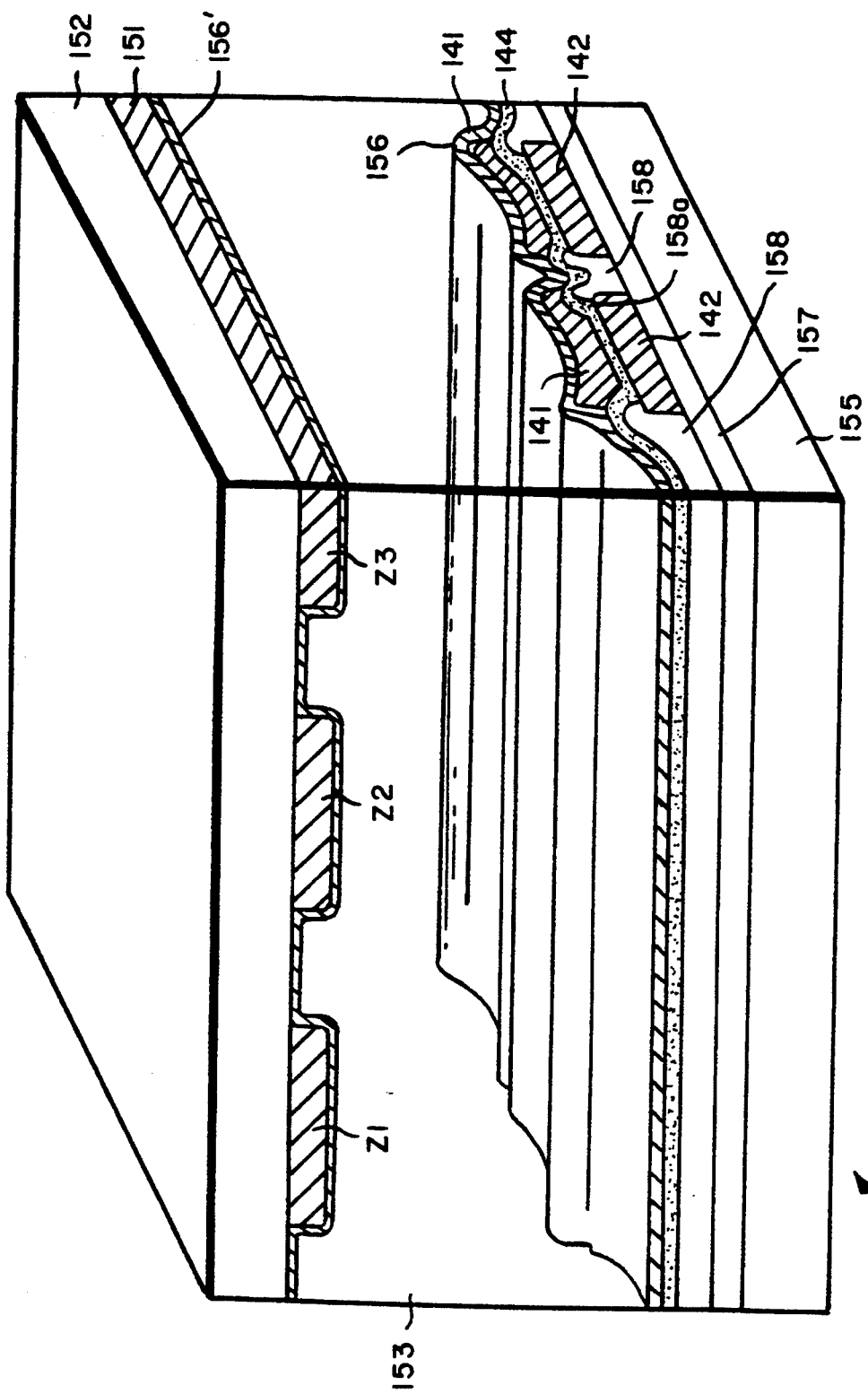
FIG. 20 is a perspective view of an essential part of a non-volatile memory device according to a fifth example of the present invention.

FIG. 20 is a perspective view of a recording section 134 of a non-volatile memory device according to a fifth example of the present invention.

The recording section 134 includes a silicon substrate 155, a field insulating film 157 provided on the silicon substrate 155, and strip-like lower electrodes 142 provided on the field insulating film 157. The lower electrodes 142 are arranged in parallel with an appropriate gap between adjacent lower electrodes 142. The insulating film 158 is provided between the adjacent lower electrodes 142. The insulating film 158 has openings 158a for exposing upper surfaces of the lower electrodes 142. A substantially flat heat generating layer 144 is provided on the insulating film 158 so as to be in contact with the upper surfaces of the lower electrodes 142 at the openings 158a. On the heat generating layer 144, strip-like upper electrodes 141 are provided. The upper electrodes 141 are in parallel with each other and also in parallel with the lower electrodes 142, respectively. Strip-like portions of the heat generating layer 144 interposed between the upper electrodes 141 and the lower electrodes 142 are heated by a voltage applied between the upper electrodes 141 and the lower electrodes 142. The upper electrodes 141 and the heat generating layer 144 are covered with an alignment film 156.

A glass substrate 152 is provided as opposed to the silicon substrate 155. On a surface of the glass substrate, the surface being opposed to the silicon substrate, strip-like counter electrodes 151 (Z1, Z2, Z3 ...) are provided with an identical gap between adjacent counter electrodes 151. The counter electrode 151 are arranged perpendicularly to the upper electrodes 141. The surface of the glass substrate 152 and the counter electrodes 151 are covered with an alignment film 156′. A liquid crystal layer 153 is enclosed between the alignment films 156 and 156′. Memory cells are formed at portions of the liquid crystal layer 153, the portions being interposed between the upper electrodes 141 and the lower electrodes 142.

Although the upper electrodes 141 and the lower electrodes 142 have a substantially identical width with each other in the fifth example, the widths thereof may be different as long as the heat generating layer 144 can be heated uniformly in strips.

The insulating film 158 has a function of insulating the adjacent lower electrodes 142 from each other and also has a function of restricting the heat generated by the heat generating layer 144 from expanding. The width of strips of the insulating film 158 is determined so that the heat from the heat generating layer 144 will not expand to the memory cells and thus influence the data written in the memory cells.

The liquid crystal layer 153 is formed of an acrylic polymeric nematic liquid crystal (Ti=106° C., degree of polymerization: 150) having p-cyanobiphenyl as a mesogen radical). Such a liquid crystal is gradually cooled from an isotropic phase while being applied with an AC voltage of 100 V and 500 Hz to be in a homeotropic structure.

The material of the liquid crystal layer 153 is not limited to the above-mentioned one. The liquid crystal layer 153 may be formed of a ferroelectric polymeric liquid crystal mentioned in the second example, a composite of a polymer and a liquid crystal compound mentioned in the third example, and a conductive polymeric liquid crystal mentioned in the fourth example or the like as long as the phase of the liquid crystal can be transited by heating and the transited phase can be kept for a long duration of time.

In the non-volatile memory device according to the fifth example, a phase transition or a change in the state is utilized for writing data, and a change in the dielectric constant accompanying the change in the state is utilized for reading data. In other words, a change from a poly-domain structure to a mono-domain structure accompanying the phase transition is utilized for writing and reading data.

Figure 21:
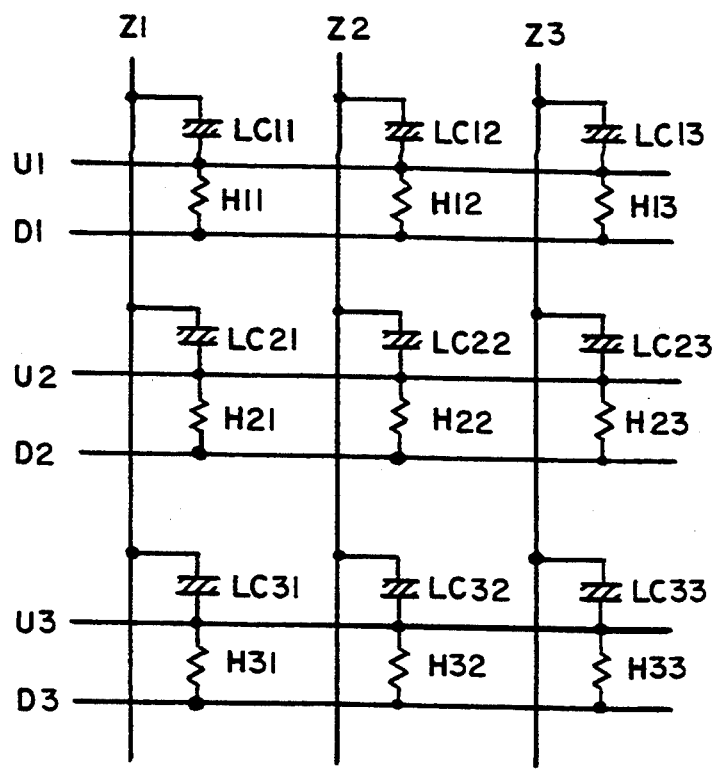
FIG. 21 is an equivalent circuit diagram of the non-volatile memory device according to the fifth example.

With reference to FIG. 21, an operation for writing and reading data in the non-volatile memory device according to the fifth example will be described.

U1, U2 and U3 denote the upper electrodes 141 and D1, D2 and D3 denote the lower electrodes 142. Z1, Z2 and Z3 denote the counter electrodes 151 perpendicular to the stripes of the upper electrodes 141 and the lower electrodes 142. The portions of the heat generating layer 144 are referred to as Hij (i is the reference number of the upper electrode 141, and j is the reference number of the counter electrode 151.) A portion of the liquid crystal layer 153 corresponding to the portion Hij of the heat generating layer 144 is referred to as LCij. (Hereinafter, each portion of the heat generating layer 144 will be referred to as a heat generating portion; and each portion of the liquid crystal layer 53 will be referred to as a liquid crystal portion.)

For writing data to the liquid crystal portion LC12, for example, a voltage is applied between the upper electrode U1 and the lower electrode D1, thereby simultaneously generating heat in the heat generating portions H11, H12 and H13. Thus, the liquid crystal portions LC11, LC12 and LC13 are put into an isotropic phase. At the same time, a voltage is applied between the upper electrode U1 and the counter electrode Z2 as a writing voltage, thereby applying an electric field to the liquid crystal portion LC12. Thus, the liquid crystal portion LC12 is aligned into a monodomain structure. Since no writing voltage is applied between the upper electrode U1 and the counter electrode Z1 or between the upper electrode U1 and the counter electrode Z3, the liquid crystal portions LC11 and LC13 are in a poly-domain structure with no alignment. Then, the application of the voltage between the upper electrode U1 and the lower electrode D1 is stopped, thereby stopping the heat generation in the heat generating portions H11 through H13. Thus, the liquid crystal portion LC12 is rapidly cooled to be put into a glass phase and is maintained in this phase. Therefore, the data written in the liquid crystal portion LC12 is kept.

Next, a voltage is applied between the upper electrode U2 and the lower electrode D2, thereby generating heat in the heat generating portions H21, H22 and H23. Data is written in the liquid crystal portions LC21, LC22 and LC23 in the same manner as mentioned above.

According to the fifth example, a voltage is independently applied between pairs of upper electrodes and lower electrodes, namely, between the upper electrode U1 and the lower electrode D1, between the upper electrode U2 and the lower electrode D2, and between the upper electrode U3 and the lower electrode D3. Accordingly, data is written in the liquid crystal portion interposed between each pair of upper and lower electrodes. Moreover, since the adjacent upper electrodes 141 and the adjacent lower electrodes 142 are insulated from each other owing to the insulating film 158, no thermal crosstalk occurs between a liquid crystal portion heated by the heat generating layer 144 and an adjacent liquid crystal portion which is not heated by the heat generating layer 144. Since each pair of upper and lower electrodes are simultaneously heated in an extending direction thereof, no thermal crosstalk occurs between the liquid crystal portions adjacent to each other in the above extending direction.

Data reading is performed by applying a specified signal between the upper electrode 141 and the counter electrode 151 and then reading a capacitance of the liquid crystal portion LCij based on an output signal at either electrode as mentioned in the first example of the present invention.

In the non-volatile memory device according to the fourth example, a liquid crystal portion is heated by the upper electrode and the lower electrode having a heat generating layer 144 therebetween. The adjacent upper electrodes are insulated from each other, and the adjacent lower electrodes are insulated from each other. Accordingly, no electric crosstalk occurs between the adjacent upper electrodes or between the adjacent lower electrodes. Moreover, since no thermal crosstalk occurs between the liquid crystal portions adjacent to each other in the extending direction of the upper and the lower electrodes 141 and 142, the pitch between the liquid crystal portions, namely, the memory cells can be small, thereby improving recording density and recording accuracy.

EXAMPLE 6

The non-volatile memory device according to the first example has a problem in that crosstalk occurs in accompaniment of thermal propagation. Table 1 shows thermal conductivity K [W/m·K or cal/s·cm·deg], thermal capacity C [J/g·K], density $\rho$ [g/m$^3$] and thermal diffusivity D [m$^2$/s] of each material used in the non-volatile memory device according to the first example.

TABLE 1

|  | Thermal Conductivity K | | Thermal capacity C j/g · k | Density $\rho$ g/m$^3$ | Thermal diffusivity D m$^2$/s |
|---|---|---|---|---|---|
|  | w/mk | cal/s · cm · deg |  |  |  |
| Liquid crystal | 0.17 | 0.0004 | 1.8 | 0.95 × 10$^6$ | 1.0 × 10$^{-7}$ |
| Si | 123 | 0.296 | 0.761 | 2.33 × 10$^6$ | 1.78 × 10$^{-4}$ |
| Glass | 1.171 | 0.0028 | 0.76 | 2.32 × 10$^6$ | 6.6 × 10$^{-7}$ |
| W | 170 | 0.408 | 0.13 | 19.1 × 10$^6$ | 6.8 × 10$^{-5}$ |
| sio$_2$ | 1.45 | 0.0035 | 1.04 | 2.22 × 10$^6$ | 6.3 × 10$^{-7}$ |
| Polyimide | 0.17 | 0.0004 | 2.0 | 1.42 × 10$^6$ | 6.0 × 10$^{-8}$ |

The thermal diffusivity D is an optimum parameter for considering thermal propagation in a non-stationary analysis. The thermal diffusivity D, the thermal conductivity K, the thermal capacity C and the density $\rho$ have the relationship expressed by Formula (7):

$$D = K/\rho \cdot C \qquad (7)$$

Figure 22:
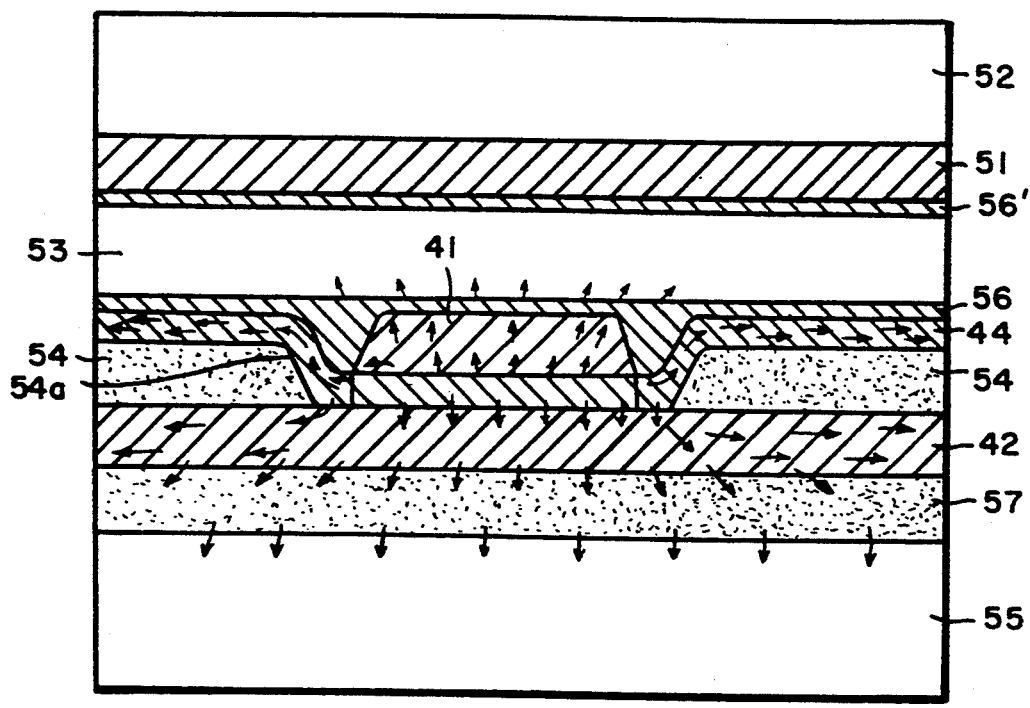
FIG. 22 is a cross sectional view showing thermal propagation in the non-volatile memory device according to the first example.

As is apparent from Table 1, the thermal diffusivity D is larger in Si (silicon) and W (tungsten) than in the other materials. In the non-volatile memory device according to the first example, the upper electrode 41 and the lower electrode 42 formed of tungsten, and the heat generating layer 44 and the silicon substrate 55 formed of silicon have a larger thermal propagation than other elements. Accordingly, an analysis of the thermal flow of an upper electrode 41, a lower electrode 42, and the heat generating layer 44 interposed therebetween is propagated as is shown by the arrows in FIG. 22, and the thermal flow is expanded to a periphery mainly through the upper electrode 41, the lower electrode 42 and the heat generating layer 44. (Hereinafter, an assembly of an upper electrode 41, a lower electrode 42 and the heat generating layer 44 interposed therebetween will be referred to as a heating element.)

Figure 23:
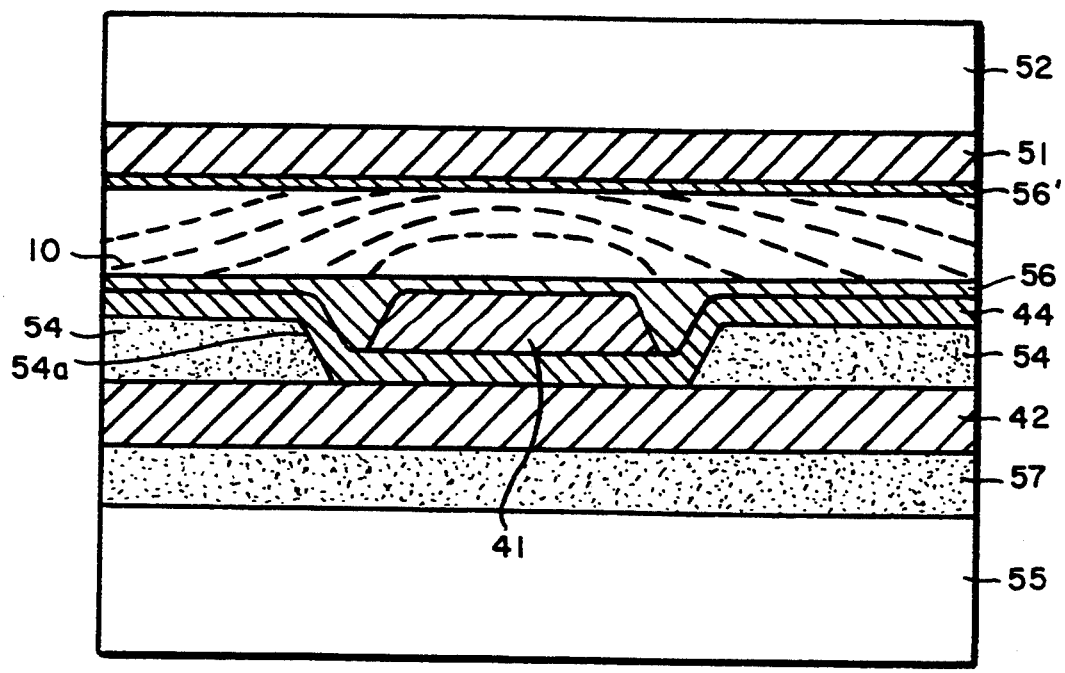
FIG. 23 is a cross sectional view showing temperature distribution in the non-volatile memory device according to the first example.

Since the thermal diffusivity D of the liquid crystal is small as is apparent from Table 1, the propagation speed of heat is low in the liquid crystal layer 53. Accordingly, the temperature distribution in the liquid crystal layer 53 is easily influenced by the temperature of the heating element, namely, by the temperature of a surface of the liquid crystal layer 53 closer to the silicon substrate 55. As a result, as is shown by isotherms 10 of FIG. 23, the temperature distribution is mild. The temperature of a portion of the liquid crystal layer 53 far from the heating element is not much lower than the temperature of the heating element.

Accordingly, when a memory cell is heated, the adjacent memory cells are also heated. In the non-volatile memory device according to the first example, heat is propagated to the memory cells adjacent to the heated memory cell which is already heated, thereby causing thermal crosstalk. This prevents improvement in writing accuracy.

This problem is solved by enlarging the gap between the adjacent memory cells. However, the enlargement of the gap between the adjacent memory cells reduces the recording density.

In a non-volatile memory device according to a sixth example of the present invention, such thermal crosstalk is reliably prevented to improve the accuracy of data writing and reading.

Figure 24:
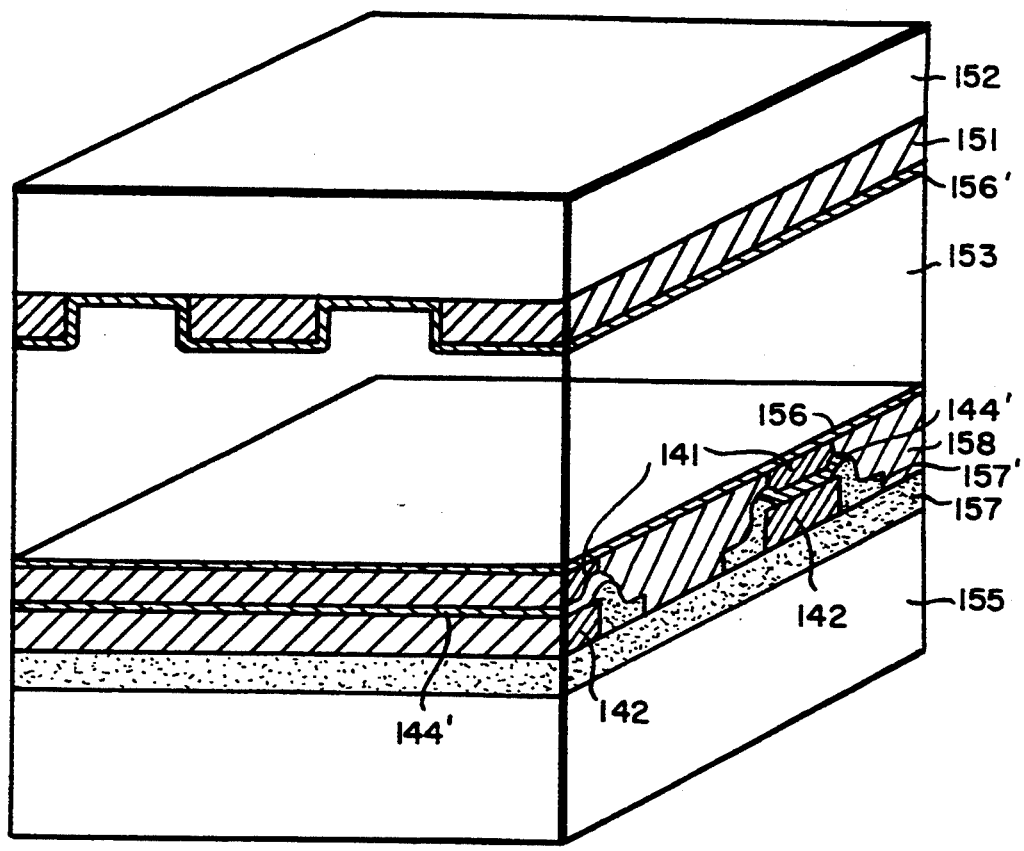
FIG. 24 is a perspective view of an essential part of a non-volatile memory device according to a sixth example of the present invention.

FIG. 24 shows a perspective view of a recording section 134 of a non-volatile memory device according to a sixth example of the present invention. Members which are identical as those in the fifth example bear the identical reference numerals. The non-volatile memory device according to the sixth example has an identical construction with that of the fifth example except for the heating element. The recording section 134 includes strip-like heat generating layers 144 respectively interposed between the upper electrodes 141 and the lower electrodes 142. The lower electrodes 142 are provided on the field insulating film 157. Side surfaces of the lower electrodes 142 in a width direction are each covered with an insulating film 157' formed of $SiO_2$, $Si_3O_4$ or the like having an excellent thermal diffusivity as the field insulating film 157. Side surfaces of the heat generating layers 144' are disposed on the insulating film 157'. Heating elements each formed of an upper electrode 141, a lower electrode 142 and a heat generating layer 144 are adjacent to each other with the insulating film 158 therebetween. The insulating film 158, which is low in thermal diffusivity, is formed of, for example, polyimide generally used for a semiconductor device and a liquid crystal display device. The insulating film 158 is in contact with a side surface of the insulating film 157', a side surface of the heat generating layer 144' and a side surface of the upper electrode 141.

An upper surface of the insulating film 158 is on the same level with upper surfaces of the upper electrodes 141. On the insulating film 158 and the upper electrodes 141, the flat alignment film 156 is provided.

On the glass substrate 152, the counter electrodes 151 perpendicular to the lower electrodes 142 are provided. The glass substrate 152 and the counter electrodes 151 are covered with the alignment film 156'. A liquid crystal layer 153 formed of an acrylic polymeric nematic liquid crystal (Ti=106° C.; degree of polymerization: 150) having p-cyanobiphenyl as a mesogen radical is filled between the glass substrate 152 and the silicon substrate 155. The liquid crystal is gradually cooled from an isotropic phase while being applied with an AC voltage of 100 V and 500 Hz to be in a homeotropic structure.

The non-volatile memory device having the above construction is produced in the following way.

On the entire surface of the silicon substrate 155, the field insulating film 157 is formed of a material having a high thermal diffusivity such as $Si_3N_4$ or $SiO_2$. On the field insulating film 157, the lower electrodes 142 are formed by depositing tungsten into a film by use of a reduced-pressure CVD method and then patterning the resultant film of tungsten.

On the field insulating film 157, the insulating film 157' is formed by depositing $Si_3N_4$ or $SiO_2$ so as to cover the lower electrodes 142 by use of a plasma CVD method or the like. By use of photolithography and dry etching, openings are formed in the insulating film 157' at portions corresponding to upper surfaces of the lower electrodes 142 and portions between the heating elements.

On the lower electrodes 142, heat generating layers 144 are formed by depositing polysilicon into a film by use of a reduced-pressure CVD method with a highly pure mono-silane gas and then patterning the resultant film of polysilicon.

On the heat generating layers 144, the upper electrodes 141 are formed by depositing tungsten into a film by use of a reduced-pressure CVD method and then patterning the resultant film of tungsten.

At the openings of the insulating film 157' between the heating elements, the insulating film 158 is formed by coating polyimide which is low in thermal diffusivity. A surface of the insulating film 158 is rubbed so as to be on the same level with the upper surfaces of the upper electrodes 141. On the insulating film 158 and the upper electrodes 141, the alignment film 156 is formed by polyimide coating by spinning followed by polymerization by heating, removal of an unnecessary portion, and then rubbing.

Figure 25:
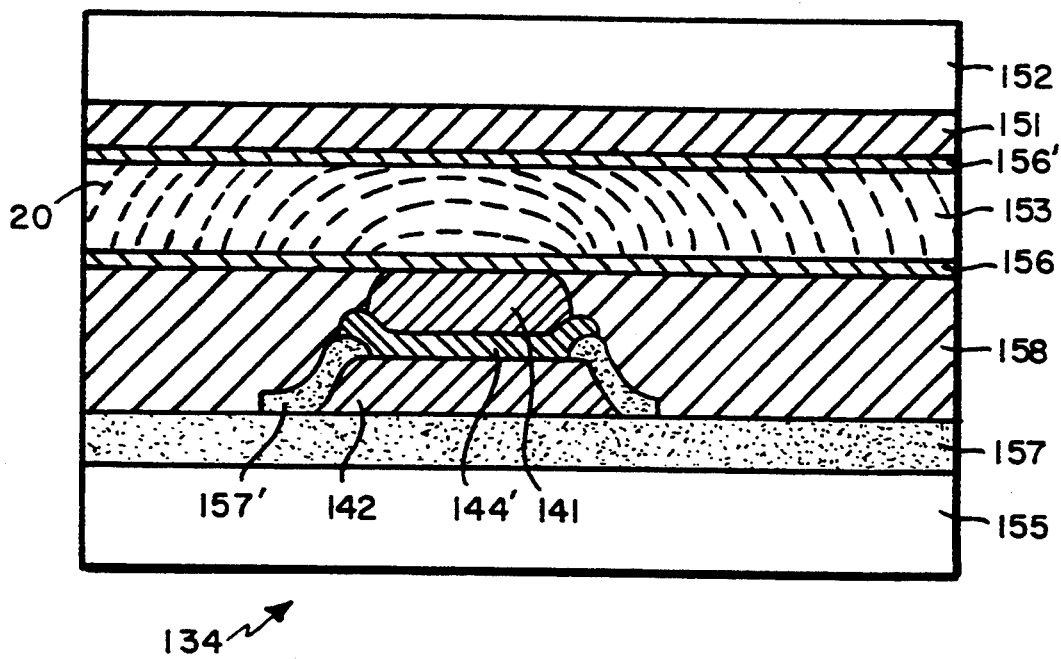
FIG. 25 is a cross sectional view showing temperature distribution in the non-volatile memory device according to the sixth example.
Figure 29:
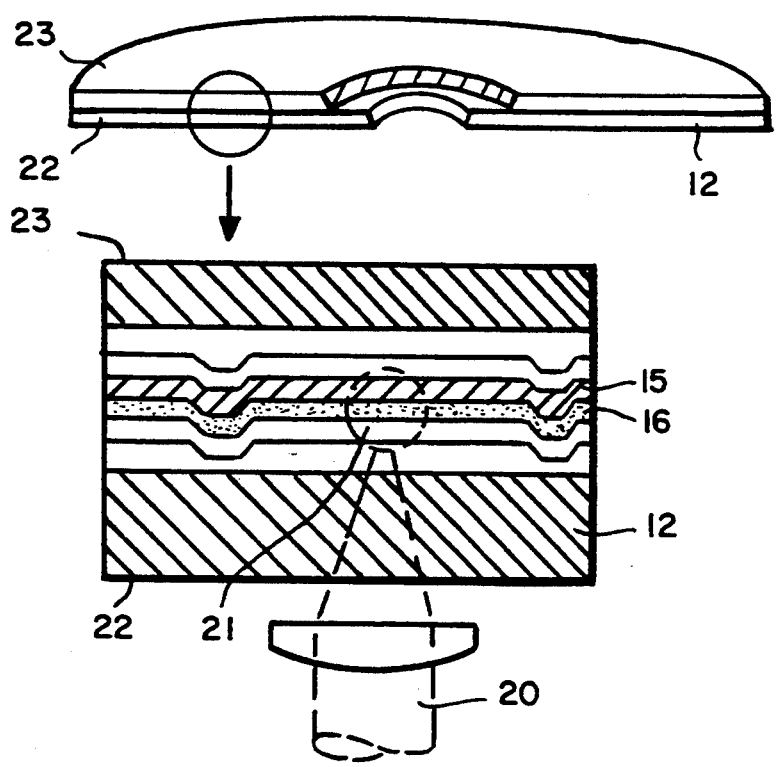
FIG. 29 is a cross sectional view of an optical magnetic disc.

FIG. 25 shows the temperature distribution of the heating element of the non-volatile memory device according to the sixth example. Heat is expanded from the heating element to the field insulating film 157 through the insulating film 157' having a high thermal diffusivity, while the thermal propagation to the adjacent heating element is restricted by the insulating film 158 having a low thermal diffusivity. Accordingly, as is shown with isotherms 20, the temperature far from the heating element is much lower than that of the heating element. Thus, no thermal crosstalk occurs between a memory cell which is heated and another memory cell adjacent in the extending direction of the heating element. Since the memory cells adjacent to each other in the extending direction of the heating element are uniformly heated, no crosstalk occurs between the memory cells adjacent in this direction.

The liquid crystal layer 153 may be formed of a conductive polymeric liquid crystal mentioned in the fourth example.

Figure 26A:
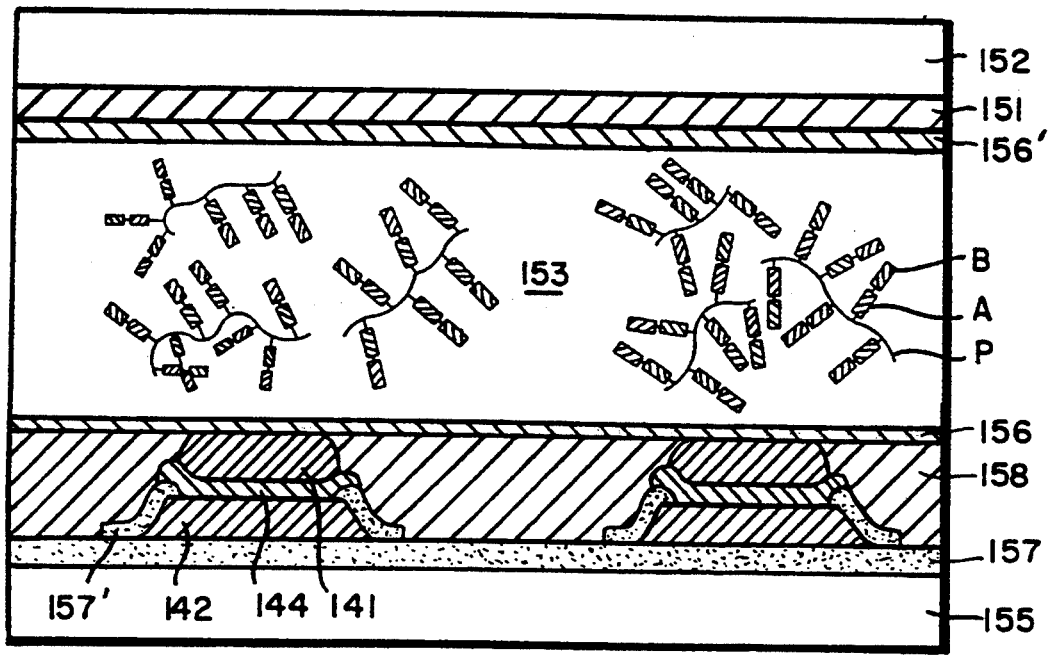
FIGS. 26A and 26B are views of an essential part of the non-volatile memory device according to the sixth example in the state where neither the mesogen radicals nor the charge-transfer complexes are aligned.
Figure 26B:
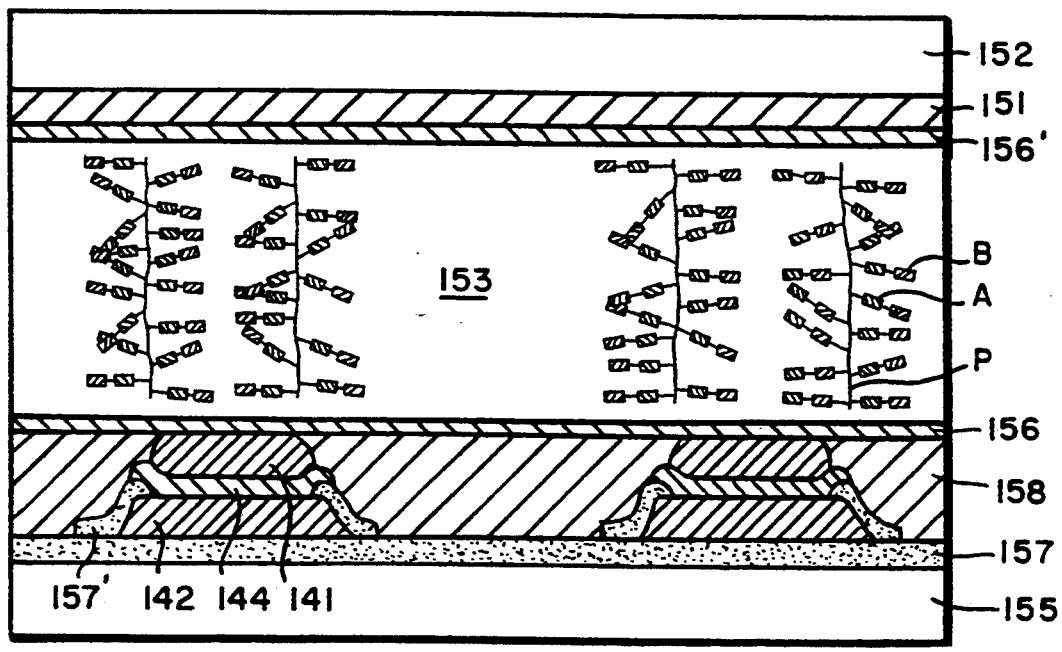
Figure 27:
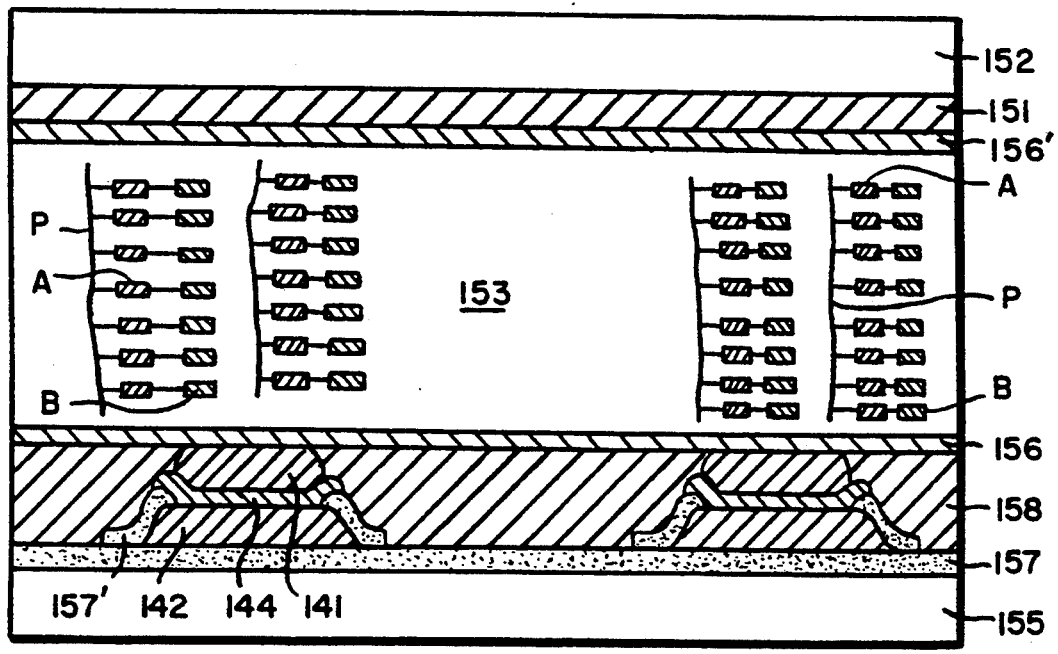
FIG. 27 is a view of an essential part of the non-volatile memory device according to the sixth example in the state where the mesogen radicals and the charge-transfer complexes are aligned.
Figure 28:
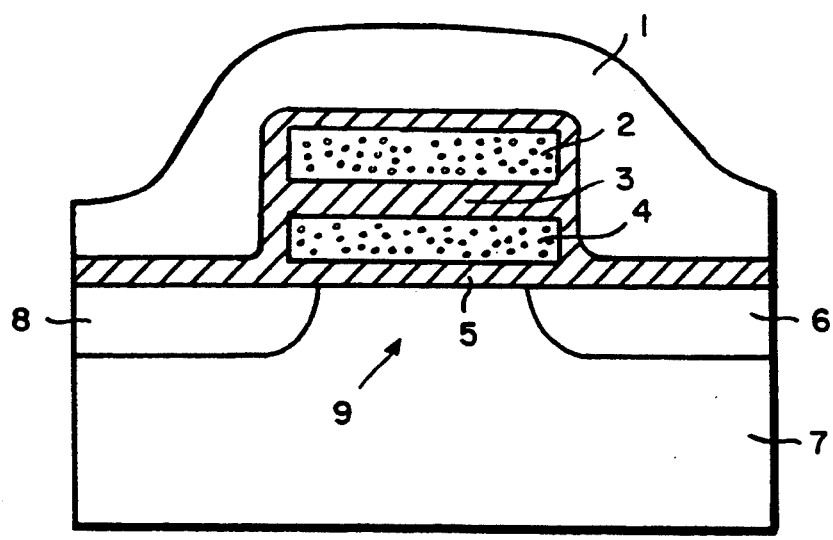
FIG. 28 is a cross sectional view of an EEPROM.

FIGS. 26A, 26B and 27 illustrate a principle of writing and reading data in the non-volatile memory device according to the sixth example.

When the liquid crystal is heated to be in an isotropic phase, and then is rapidly cooled while being applied with a voltage between the upper electrode 141 and the counter electrode 151 as a writing voltage, the mesogen radicals A are aligned, and the conductance supplying radicals B are forcibly arranged in order by the alignment of the mesogen radicals A. Since the electric charges can move through the adjacent conductance supplying radicals B, the liquid crystal turns conductive between the counter electrode 151 and the upper electrode 141 as is shown in FIG. 27.

On the other hand, when the liquid crystal is rapidly cooled from an isotropic phase without applying a writing voltage, the mesogen radicals A are not aligned, and thus the conductance supplying radicals B are not arranged in order. Accordingly, the liquid crystal has a high electrical resistance with no conductance. FIGS. 26A and 26B show the highly resistive state of the liquid crystal. In FIG. 26A, the polymeric main chains P, the mesogen radicals A, and the conductance supplying radicals B are all in disorder. In FIG. 26B, the polymeric main chains P are arranged in order, but the mesogen radicals A are not aligned and thus the conductance supplying radicals B are not arranged in order. Accordingly, the liquid crystal has no conductance. In FIGS. 26A and 26B, the liquid crystal has a high electrical resistance between the counter electrode 151 and the upper electrode 141. Whether the liquid crystal is put into the state of FIG. 26A or FIG. 26B depends on various elements such as heating conditions, alignment conditions by the alignment films 156 and 156', and the type of the conductive polymeric liquid crystal. It is desirable to select such elements as realize the state of FIG. 26B in order to obtain a high speed response.

The conductance and the electrical resistance of the liquid crystal are judged by applying an AC or a DC voltage between the upper electrode 141 and the counter electrode 151 to measure the impedance or the conductivity of the liquid crystal. A practical operation for writing and reading data is identical with that of the fourth example.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile memory device, comprising:
a memory medium which is formed of a material selected from the group consisting of a liquid crystal composite and a composite including a liquid crystal component in a molecule;
heating means including a pair of electrode layers and a heat generating layer interposed between the electrode layers, the heating means being provided for writing data into the memory medium by heating the memory medium through the heat generating layer and thus permitting an electrical property of the memory medium to be changed; and
reading means for reading the data written into the memory medium by electrically detecting said electrical property of the memory medium.

2. A non-volatile memory device according to claim 1, further including a first substrate and a second substrate,
wherein the memory medium is filled between the first substrate and the second substrate,
wherein the first substrate has a counter electrode provided on a surface thereof, the surface being opposed to the memory medium,
wherein the pair of electrode layers include strip-like lower electrodes provided on the second substrate arranged in parallel with and insulated from one another, and strip-like upper electrodes arranged in parallel and insulated from one another, the upper electrodes being respectively arranged perpendicular to the lower electrodes, and
wherein the heat generating layer is sandwiched between the lower electrodes and the upper electrodes.

3. A non-volatile memory device according to claim 2, wherein the memory medium is formed of a material selected from the group consisting of a polymeric nematic liquid crystal, a polymeric smectic liquid crystal, a polymeric cholesteric liquid crystal, a liquid crystal material including at least two types of liquid crystal components in one molecule, and a mixture of a polymeric nematic liquid crystal, a polymeric smectic liquid crystal and a polymeric cholesteric liquid crystal.

4. A non-volatile memory device according to claim 2, wherein the memory medium is formed of a ferroelectric polymeric liquid crystal.

5. A non-volatile memory device according to claim 2, wherein the memory medium is formed of a composite of a polymer and a liquid crystal compound.

6. A non-volatile memory device according to claim 2, wherein the reading means detects a difference between a dielectric constant of the memory medium in a mono-domain structure and a dielectric constant of the memory medium in a poly-domain structure by use of the counter electrode and the upper electrodes.

7. A non-volatile memory device according to claim 4, wherein the reading means detects a difference between dielectric constants of the ferroelectric polymer liquid crystal in different alignment states by use of the counter electrode and the upper electrodes.

8. A non-volatile memory device according to claim 4, wherein the reading means detects a difference between degrees of spontaneous polarization of the ferroelectric polymer liquid crystal in different alignment states by use of the counter electrode and each upper electrode.

9. A non-volatile memory device according to claim 5, wherein the reading means detects a difference between dielectric constants of the liquid crystal compound in different alignment states by use of the counter electrode and each upper electrode.

10. A non-volatile memory device according to claim 2, wherein the memory medium is formed of a conductive polymer liquid crystal.

11. A non-volatile memory device according to claim 10, wherein the reading means detects a change in conductivity of the conductive polymer liquid crystal by use of the counter electrode and the upper electrodes.

12. A non-volatile memory device according to claim 10, wherein the memory medium is in contact with a conductive alignment film.

13. A non-volatile memory device according to claim 1, further including a first substrate and a second substrate,
wherein the memory medium is filled between the first substrate and the second substrate,
wherein the pair of electrode layers include strip-like lower electrodes provided on the second substrate arranged in parallel with and insulated from one another, and strip-like upper electrodes respectively overlapping the lower electrodes,
wherein the heating layer is sandwiched between the lower electrodes and the upper electrodes, and
wherein the first electrode has counter electrodes thereon which are arranged in parallel with and insulated from one another, and are respectively arranged perpendicular to the upper substrate, the counter electrodes being applied with a voltage to write data into the memory medium after the memory medium is heated and thus the phase thereof is changed.

14. A non-volatile memory device according to claim 13, wherein the memory medium is formed of a material selected from the group consisting of a polymeric nematic liquid crystal, a polymeric smectic liquid crystal, a polymeric cholesteric liquid crystal, a liquid crystal material including at least two types of liquid crystal components in one molecule, and a mixture of a polymeric nematic liquid crystal, a polymeric smectic liquid crystal and a polymeric cholesteric liquid crystal.

15. A non-volatile memory device according to claim 13, wherein the memory medium is formed of a ferroelectric polymeric liquid crystal.

16. A non-volatile memory device according to claim 13, wherein the memory medium is formed of a composite of a polymer and a liquid crystal compound.

17. A non-volatile memory device according to claim 13, wherein the reading means detects a difference between a dielectric constant of the memory medium in a mono-domain structure and a dielectric constant of the memory medium in a poly-domain structure by use of the counter electrodes and the upper electrodes.

18. A non-volatile memory device according to claim 15, wherein the reading means detects a difference between dielectric constants of the ferroelectric polymer liquid crystal in different alignment states by use of the counter electrodes and the upper electrodes.

19. A non-volatile memory device according to claim 15, wherein the reading means detects a difference between degrees of spontaneous polarization of the ferroelectric polymer liquid crystal in different alignment states by use of the counter .electrodes and the upper electrodes.

20. A non-volatile memory device according to claim 16, wherein the reading means detects a difference between dielectric constants of the liquid crystal compound in different alignment states by use of the counter electrodes and the upper electrodes.

21. A non-volatile memory device according to claim 13, wherein the memory medium is formed of a conductive polymer liquid crystal.

22. A non-volatile memory device according to claim 21, wherein the reading means detects a change in conductivity of the conductive polymer liquid crystal by use of the counter electrodes and the upper electrodes.

23. A non-volatile memory device according to claim 21, wherein the memory medium is in contact with a conductive alignment film.

24. A non-volatile memory device according to claim 13, wherein the heat generating layer is substantially flat above the first substrate so as to be existent even between the lower electrodes.

25. A non-volatile memory device according to claim 13, wherein the heat generating layer is divided into stripes so as to be sandwiched only between a pair of the lower electrode and the upper electrode overlapping with each other, and an insulating film formed of a material having a low thermal diffusivity is provided between adjacent assemblies each formed of each lower electrode, the upper electrode overlapping the lower electrode and a strip of the heat generating layer interposed between the lower electrode and the upper electrode.

26. A non-volatile memory device according to claim 2, wherein the second substrate is a silicon substrate.

27. A non-volatile memory device according to claim 26, wherein the silicon substrate has a field insulating film provided on a surface thereof, the surface having the lower electrodes thereon.

28. A non-volatile memory device according to claim 27, wherein side surfaces of the lower electrodes in a width direction are covered with an insulating film formed of a material having a low thermal diffusivity.

29. A non-volatile memory device, comprising:
a memory medium which is formed of a material selected from the group consisting of a liquid crystal composite and a composite including a liquid crystal component in a molecule;
heating means including a pair of electrode layers and a heat generating layer interposed between the electrode layers, the heating means being provided for writing data into the memory medium by heating the memory medium through the heat generating layer and thus permitting on optical property of the memory medium to be changed;
reading means for reading the data written into the memory medium by optically detecting said optical property of the memory medium; and
a first substrate and a second substrate;
wherein the memory medium is filled between the first substrate and second substrate,
wherein the first substrate has a counter electrode provided on a surface thereof, the surface being opposed to the memory medium,
wherein the pair of electrode layers include strip-like electrode provided on the second substrate arranged in parallel with and insulated from one another, and strip-like upper electrodes arranged in parallel and insulated from one another, the upper electrode being respectively arranged perpendicular to the lower electrodes, and
wherein the heat generating layer is sandwiched between the lower electrodes and the upper electrodes.

30. A non-volatile memory device according to claim 29, wherein the reading means optically detects a non-transparent state and a transparent state of the memory medium.

31. A non-volatile memory device according to claim 29, wherein the memory medium is formed of a material selected from the group consisting of a polymeric nematic liquid crystal, a polymeric smectic liquid crystal, a polymeric cholesteric liquid crystal, a liquid crystal material including at least two types of liquid crystal components in one molecule, and a mixture of a polymeric nematic liquid crystal, a polymeric smectic liquid crystal and a polymeric cholesteric liquid crystal.

32. A non-volatile memory device according to claim 29, wherein the memory medium is formed of a ferroelectric polymeric liquid crystal.

33. A non-volatile memory device according to claim 29, wherein the memory medium is formed of a composite of a polymer and a liquid crystal compound.

34. A non-volatile memory device according to claim 29, wherein the memory medium is formed of a conductive polymer liquid crystal.

35. A non-volatile memory device according to claim 34, wherein the memory medium is in contact with a conductive alignment film.

36. A non-volatile memory device, comprising:

a memory medium which is formed of a material selected from the group consisting of a liquid crystal composite and a composite including a liquid crystal component in a molecule;

heating means including a pair of electrode layers and a heat generating layer interposed between the electrode layers, the heating means being provided for writing data into the memory medium by heating the memory medium through the heat generating layer and thus permitting an optical property of the memory medium to be changed;

reading means for reading the data written into the memory medium by optically detecting said optical property of the memory medium; and a first substrate and a second substrate;

wherein the memory medium is filled between the first substrate and the second substrate, wherein the pair of electrode layers include strip-like lower electrodes provided on the second substrate arranged in parallel with and insulated from one another, and strip-like upper electrodes respectively overlapping the lower electrodes, wherein the heating layer is sandwiched between the lower electrodes and the upper electrodes, and wherein the first substrate has counter electrodes thereon which are arranged in parallel with and insulated from one another, and are respectively arranged perpendicular to the upper electrodes, the counter electrodes being applied with a voltage to write data into the memory medium after the memory medium is heated and thus the optical property thereof is changed.

37. A non-volatile memory device according to claim 36, wherein the memory medium is formed of a material selected from the group consisting of a polymeric nematic liquid crystal, a polymeric smectic liquid crystal, a polymeric cholesteric liquid crystal, a liquid crystal material including at least two types of liquid crystal components in one molecule, and a mixture of a polymeric nematic liquid crystal, a polymeric smectic liquid crystal and a polymeric cholesteric liquid crystal.

38. A non-volatile memory device according to claim 36, wherein the reading means optically detects a non-transparent state and a transparent state of the memory medium.

39. A non-volatile memory device according to claim 36, wherein the memory medium is formed of a ferroelectric polymeric liquid crystal.

40. A non-volatile memory device according to claim 36, wherein the memory medium is formed of a composite of a polymer and a liquid crystal compound.

41. A non-volatile memory device according to claim 36, wherein the memory medium is formed of a conductive polymer liquid crystal.

42. A non-volatile memory device according to claim 41, wherein the memory medium is in contact with a conductive alignment film.

43. A non-volatile memory device according to claim 36, wherein the heat generating layer is substantially flat above the first substrate so as to be existent even between the lower electrodes.

44. A non-volatile memory device according to claim 36, wherein heat generating layer is divided into stripes so as to be sandwiched only between a pair of the lower electrode and the upper electrode overlapping with each other, and an insulating film formed of a material having a low thermal diffusivity is provided between adjacent assemblies each formed of each lower electrode, the upper electrode overlapping the lower electrode and a strip of the heat generating layer interposed between the lower electrode and the upper electrode.

45. A non-volatile memory device according to claim 29, wherein the second substrate is a silicon substrate.

46. A non-volatile memory device according to claim 45, wherein the silicon substrate has a field insulating film provided on a surface thereof, the surface having the lower electrodes thereon.

47. A non-/volatile memory device according to claim 46, wherein side surfaces of the lower electrodes in a width direction are covered with an insulating film formed of a material having a low thermal diffusivity.

48. A non-volatile memory device, comprising:

a memory medium formed between a first substrate and a second substrate, said memory medium comprising a plurality of memory cells formed of a liquid crystal material;

a plurality of electrothermal heating means, each of said plurality of electrothermal heating means being positioned adjacent a corresponding one of said memory cells;

writing means for writing data to said memory device by selectively activating at least one of said electrothermal heating means whereby said liquid crystal material in said memory cell corresponding to said selectively activated electrothermal heating means is heated to permit a change in a property of said liquid crystal material; and reading means for reading the data written to said memory device by detecting said change in said property.

49. The memory device of claim 48, wherein each of said plurality of electrothermal heating means comprises a pair of electrodes with a heat generating layer interposed between said pair of electrodes.

50. A non-volatile memory device according to claim 36, wherein the stripe-like lower electrodes extend in the same direction and the stripe-like upper electrodes extend in the same direction.

* * * * *

UNITED STATES PATENT AND TRADEMARK OFFICE
CERTIFICATE OF CORRECTION

PATENT NO.  : 5,444,651
DATED       : August 22, 1995
INVENTOR(S) : Yamamoto et al.

It is certified that error appears in the above-indentified patent and that said Letters Patent is hereby corrected as shown below:

On the Cover page, after "[22] Filed:", please delete "Sep. 9, 1992444651331002365182" and insert --Sep. 9, 1992--.

On the Cover page, column 1, after "[22] Filed:   Sep. 9, 1992444651331002365182", please insert:

--[30] Foreign Application Priority Data
    October 30, 1991 [JP] Japan        JP 3-285135
    October 30, 1991 [JP] Japan        JP 3-285136
    November 1, 1991 [JP] Japan        JP 3-287672--.

Column 28, line 67 (claim 13), please delete "electrode" and insert --substrate--.

Column 29, line 2 (claim 13), please delete "substrate" and insert --electrodes--.

Signed and Sealed this

Tenth Day of September, 1996

Attest:

BRUCE LEHMAN

*Attesting Officer*      *Commissioner of Patents and Trademarks*